United States Patent
Kimura et al.

(10) Patent No.: US 10,734,933 B2
(45) Date of Patent: Aug. 4, 2020

(54) MOTOR CONTROL APPARATUS

(71) Applicant: Mitsubishi Electric Corporation, Chiyoda-ku (JP)

(72) Inventors: Masaya Kimura, Tokyo (JP); Hidetoshi Ikeda, Tokyo (JP); Nobuhiro Shinohara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/093,192

(22) PCT Filed: Apr. 27, 2017

(86) PCT No.: PCT/JP2017/016753
§ 371 (c)(1),
(2) Date: Oct. 12, 2018

(87) PCT Pub. No.: WO2017/208701
PCT Pub. Date: Dec. 7, 2017

(65) Prior Publication Data
US 2019/0123672 A1    Apr. 25, 2019

(30) Foreign Application Priority Data
May 31, 2016    (JP) .................................. 2016-108954

(51) Int. Cl.
*H02P 23/12*    (2006.01)
*H03H 21/00*    (2006.01)
(Continued)

(52) U.S. Cl.
CPC .............. *H02P 23/12* (2013.01); *G05B 11/36* (2013.01); *H02P 23/04* (2013.01); *H02P 29/10* (2016.02); *H03H 21/0021* (2013.01)

(58) Field of Classification Search
None
See application file for complete search history.

(56) References Cited

U.S. PATENT DOCUMENTS 5,404,418 A * 4/1995 Nagano .................. G05B 19/19
                                                                388/806
7,031,094 B2    4/2006 Chung
(Continued)

FOREIGN PATENT DOCUMENTS

| JP | 2005-149711 A | 6/2005 |
| JP | 2009-104439 A | 5/2009 |
| JP | 2009-296746 A | 12/2009 |

OTHER PUBLICATIONS

International Search Report dated Aug. 8, 2017, in PCT/JP2017/016753, filed Apr. 27, 2017.

*Primary Examiner* — Bickey Dhakal
(74) *Attorney, Agent, or Firm* — Xsensus LLP

(57) ABSTRACT

A motor control apparatus includes: an oscillation instruction unit outputting an oscillation instruction signal; a filter unit performing filtering processing having frequency characteristic defined by a filter parameter; an oscillation forcing unit configuring a control loop in an oscillation period together with the filter unit, a current control unit, a motor, and a velocity calculation unit and causing the control loop to oscillate during the oscillation period in which the oscillation instruction signal is in the on-state; an amplitude evaluation unit acquiring, as an evaluation value, the amplitude ratio of an input signal to an output signal of the oscillation forcing unit when the control loop oscillates; and a filter adjustment unit comparing evaluation values provided when filter parameter candidates are set in the filter unit sequentially, selecting one of the filter parameters achieving a smaller evaluation value, and setting the selected filter parameter in the filter unit.

14 Claims, 9 Drawing Sheets

(51) Int. Cl.
*H02P 29/10* (2016.01)
*G05B 11/36* (2006.01)
*H02P 23/04* (2006.01)

(56) References Cited

U.S. PATENT DOCUMENTS

| | | | | |
|---|---|---|---|---|
| 8,378,615 | B2* | 2/2013 | Tazawa | H02P 29/50 |
| | | | | 318/619 |
| 8,901,872 | B2 | 12/2014 | Tazawa et al. | |
| 2008/0309279 | A1* | 12/2008 | Tazawa | H02P 23/04 |
| | | | | 318/619 |
| 2020/0083834 | A1* | 3/2020 | Fujiwara | H02P 23/04 |

* cited by examiner

FIG.4

| | FILTER PARAMETER Fp | | | | | | EVALUATION VALUE Ev |
|---|---|---|---|---|---|---|---|
| | NOTCH FILTER ENABLED OR DISABLED | NOTCH FREQUENCY wn | FACTOR za | FACTOR zb | LOW-PASS FILTER ENABLED OR DISABLED | CUTOFF FREQUENCY wl | |
| FIRST SET OF FILTER PARAMETER CANDIDATES | ENABLED | 900 | 0.1 | 0.0 | ENABLED | 4000 | 1 |
| SECOND SET OF FILTER PARAMETER CANDIDATES | ENABLED | 1000 | 0.3 | 0.2 | DISABLED | 0 | 0.2 |
| THIRD SET OF FILTER PARAMETER CANDIDATES | ENABLED | 1300 | 0.3 | 0.4 | DISABLED | 0 | 0.4 |

MOTOR CONTROL APPARATUS

FIELD

The present invention relates to a motor control apparatus that controls a motor that drives a mechanical load.

BACKGROUND

In a motor control apparatus that is coupled to a mechanical load and a motor, vibration may be caused at the resonance frequency in the process of widening the control band in velocity control because of a resonance characteristic that is dependent on the inertia ratio between the mechanical load and the motor and on the rigidity of the machine. To provide stable and highly responsive control, a velocity controller and a frequency characteristic of a filter need to be adjusted such that the vibration at the resonance frequency is reduced and the velocity control band of the motor is enlarged. When a notch filter is used as the filter, it is necessary to adjust the notch frequency, which is the frequency at the center of a band through which input signals are attenuated, and the width (band width) and the depth (attenuation amplitude) for the attenuation. When manually adjusting the frequency characteristic of the filter, an operator is required to operate the mechanical system every time a parameter of the filter and a control gain of the velocity controller are changed and to repeat a process including measurement of a response and determination of whether the response is good or bad.

As a technique for adjusting a frequency characteristic of a filter in accordance with a resonance characteristic of a mechanical system, techniques described in Patent Literatures 1 and 2 are disclosed.

The technique described in Patent Literature 1 includes a vibration-extracting filter having a band-pass characteristic of extracting a vibration component at a predetermined band frequency included in a velocity detection value and uses the magnitude of the amplitude of the extracted vibration component as an evaluation index. The disclosed technique searches for and adjusts the notch frequency on the basis of a gradient method such that this evaluation index is minimized.

In the technique described in Patent Literature 2, the amount of operation having a high frequency component induced by the action of a filter having a high-pass characteristic on the amount of operation output by a controller is applied to a motor. The disclosed technique calculates the resonance frequency by performing Fourier transform on the position detection value induced here and adjusts the notch frequency of a notch filter to the resonance frequency.

CITATION LIST

Patent Literature

Patent Literature 1: Japanese Patent Application Laid-open No. 2009-296746 (page 7 to 8, FIG. 4)
Patent Literature 2: Japanese Patent Application Laid-open No. 2005-149711 (page 14 to 16, FIG. 2)

SUMMARY

Technical Problem

The technique described in Patent Literature 1 is problematic in that filter adjustment that maintains the stability of the velocity control and maximizes the control band cannot be performed and that it may not be possible to perform the adjustment depending on the presetting condition in a velocity control unit.

A first reason is as follows. Placing a notch filter in a velocity control loop causes a phase delay in a frequency band lower than the notch frequency in an open loop characteristic; thus, the phase is delayed by 180 degrees or more in the low frequency band, which may cause degradation in stability of the velocity control and a vibratory response. The evaluation method using a band-pass filter to extract only a high frequency band near the resonance frequency does not allow for evaluation of a vibration component in a low frequency band and thus cannot prevent degradation in stability of the velocity control. Setting the notch filter, thus, may cause degradation in stability of the low frequency band. Specifically, a measure of reducing the control band in the velocity control becomes necessitated after the adjustment of the notch filter to maintain the stability; thus, filter adjustment that maximizes the velocity control band cannot be provided.

A second reason is as follows. The technique described in Patent Literature 1 is a technique with which only the notch frequency can be adjusted. When the amplitude of the extracted vibration component is used as the evaluation index, the evaluation index decreases as a gain reducing characteristic of the filter increases in the extracted frequency band for any mechanical system. In an attempt to, for example, adjust the depth (attenuation amplitude) and width (band width) of the notch filter using the technique described in Patent Literature 1, the evaluation index decreases in a monotone as the depth of the notch filter increases (as the attenuation amplitude increases). The evaluation index also decreases in a monotone as the width of the notch filter increases (as the band width increases). Thus, appropriateness of the notch filter cannot be evaluated, and the depth and width of the notch filter cannot be adjusted. Favorable adjustment of the frequency characteristic of the filter thus cannot be provided. Therefore, filter adjustment that maximizes the velocity control band cannot be provided.

A third reason is as follows. With the technique described in Patent Literature 1, the notch frequency cannot be adjusted if a vibration component is not included in a preselected band. When, for example, a control gain of the velocity control unit is set so as to be small in advance, vibration is not induced and thus progress is not made in searching for a filter parameter; therefore, the filter adjustment cannot be performed. It is thus necessary to set the velocity gain of the velocity control unit by trial and error in order to adjust the notch filter.

As described above, filter adjustment that maximizes the velocity control band cannot be realized by using the technique described in Patent Literature 1; additionally, it may not be possible to perform the adjustment depending on the presetting condition in a velocity control unit.

The technique described in Patent Literature 2 is a technique in which a filter having a high-pass characteristic acts to excite a band near the resonance frequency, a resonance characteristic is determined, and a filter is adjusted such that a gain characteristic at the resonance frequency is reduced.

The evaluation method using the filter having a high-pass characteristic to extract only a high frequency band near the resonance frequency, however, does not allow for evaluation of a vibration component in a low frequency band and thus cannot prevent degradation in stability of the velocity control for the same reason as the first reason described above concerning the technique in Patent Literature 1. Setting the notch filter, thus, may cause degradation in stability of the low frequency band. Specifically, a measure of reducing the control band in the velocity control becomes necessitated after the adjustment of the notch filter to maintain the stability; thus, filter adjustment that maximizes the velocity control band cannot be provided.

The technique described in Patent Literature 2 thus is problematic in that filter adjustment that maximizes the velocity control band cannot be performed and that a trial and error operation by an operator is required for the filter adjustment.

Additionally, in both of the techniques in Patent Literatures 1 and 2, a notch filter is adjusted such that only a frequency component at the extracted vibration is reduced. The notch frequency is thus set to a frequency of the extracted vibration. Setting the notch frequency to a frequency different from the vibration frequency may, however, lead to a wider velocity control band in many cases. In such cases, the velocity control band cannot be maximized by using the technique in Patent Literature 1 or 2.

The present invention has been achieved in view of the above, and an object of the present invention is to provide a motor control apparatus that enables filter adjustment that maximizes a velocity control band with ease regardless of a presetting condition of a control gain in a velocity control unit and without the burden of trial and error.

Solution to Problem

In order to solve the above problem and achieve the object, a motor control apparatus according to an aspect of the present invention calculates, on a basis of a velocity signal that indicates velocity of a motor coupled to a mechanical load and a velocity command that is a command value for the velocity of the motor, a torque command that is a command value for torque of the motor to control the motor. The motor control apparatus includes: a velocity control unit to calculate and output a first operation signal such that the velocity signal agrees with the velocity command; a current control unit to provide current to the motor on a basis of the torque command; a velocity calculation unit to output the velocity signal; an oscillation instruction unit to output an oscillation instruction signal that is a signal indicative of an on-state that gives an instruction to cause oscillation or an off-state that gives an instruction to stop the oscillation; a filter unit to perform filtering processing having a frequency characteristic defined by a filter parameter; an oscillation forcing unit configuring a control loop in an oscillation period together with the filter unit, the current control unit, the motor, and the velocity calculation unit to cause the control loop in the oscillation period to oscillate during the oscillation period when the oscillation instruction signal is in the on-state; an amplitude evaluation unit to acquire, as an evaluation value, a ratio of an amplitude of an input signal of the oscillation forcing unit to an amplitude of an output signal of the oscillation forcing unit when the control loop in the oscillation period is caused to oscillate by the oscillation forcing unit; and a filter adjustment unit to acquire evaluation values that are provided when a plurality of filter parameter candidates are set in the filter unit sequentially, select by comparing the evaluation values the filter parameter that achieves a smaller evaluation value, and set the selected filter parameter in the filter unit.

Advantageous Effects of Invention

The present invention can provide a motor control apparatus that enables filter adjustment that maximizes a velocity control band with ease regardless of a presetting condition of a control gain in a velocity control unit and without the burden of trial and error.

BRIEF DESCRIPTION OF DRAWINGS

FIG. 4 is a diagram illustrating examples of parameter candidates and evaluation values retained in the motor control apparatus according to the first embodiment of the present invention.

DESCRIPTION OF EMBODIMENTS

Exemplary embodiments of a motor control apparatus according to the present invention are described in detail below with reference to the drawings. The embodiments described below are presented as examples; the present invention is not limited to the embodiments.

First Embodiment

Figure 1:
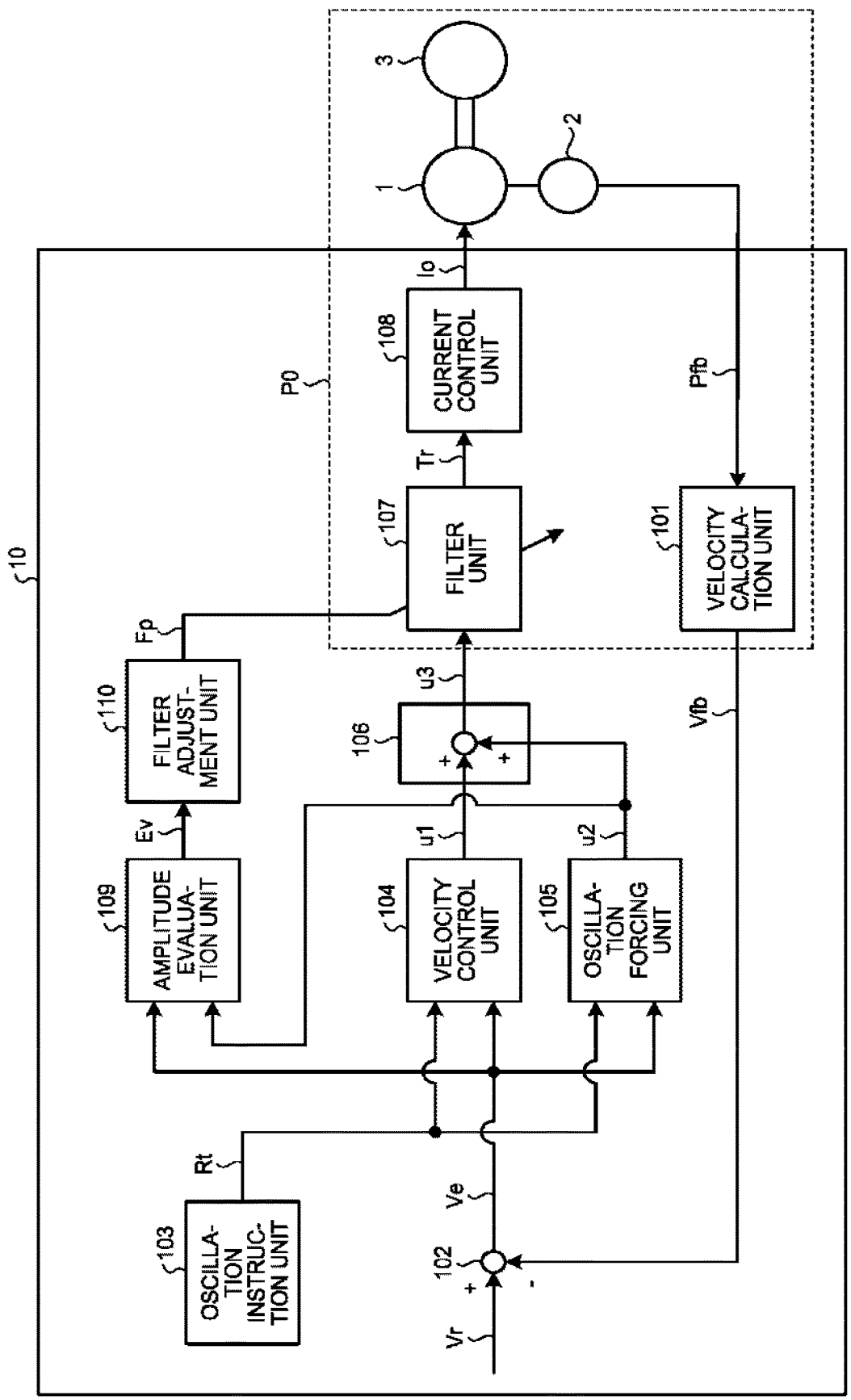
FIG. 1 is a block diagram illustrating a configuration of a motor control apparatus according to a first embodiment of the present invention.

FIG. 1 is a block diagram illustrating a configuration of a motor control apparatus 10 according to a first embodiment of the present invention.

As illustrated in FIG. 1, the motor control apparatus 10 is connected to a motor 1 and a motor position detector 2. The motor control apparatus 10 receives a position signal Pfb, which is a signal indicative of the position of the motor, and outputs a current Io. The current Io is a current for the motor 1 to generate torque in accordance with a torque command Tr. The motor 1 is coupled to a mechanical load 3. The motor 1 uses the current Io to generate torque such that the torque follows the torque command Tr. The motor position detector 2 is a device that detects the position of the motor 1 and outputs the position signal Pfb.

The position of the motor 1 is a rotational position of a mover that is included in the motor 1 or a relative position of the mover with respect to a stator.

FIG. 1 illustrates an exemplary configuration of a mechanical system for which the motor control apparatus 10 according to the first embodiment of the present invention is used.

The motor control apparatus 10 includes, as its constituent elements, a velocity calculation unit 101, a subtracter 102, an oscillation instruction unit 103, a velocity control unit 104, an oscillation forcing unit 105, a third-operation-signal output unit 106, a filter unit 107, a current control unit 108, an amplitude evaluation unit 109, and a filter adjustment unit 110.

An operation of the motor control apparatus 10 according to the present embodiment is described next.

The velocity calculation unit 101 receives the position signal Pfb and calculates and outputs a velocity signal Vfb, which is a signal indicative of the velocity of the motor 1. Here, the position signal Pfb is subjected to, for example, a differential operation to obtain the velocity signal Vfb.

The subtracter 102 calculates a deviation of the velocity signal Vfb from a velocity command Vr, which is a signal indicative of a command value for the velocity of the motor 1, and outputs the result as a velocity deviation Ve.

The oscillation instruction unit 103 outputs an oscillation instruction signal Rt, which is a signal indicative of an on-state that gives an instruction to cause oscillation or an off-state that gives an instruction to stop the oscillation. Starting its operation on the basis of an operation external to the mechanical system, the oscillation instruction unit 103 alternately outputs the oscillation instruction signal Rt in the on-state or the off-state a predetermined number of times and then stops the operation. A time period over which the oscillation instruction signal Rt is in the on-state is referred to as an oscillation period, and a time period over which the oscillation instruction signal Rt is in the off-state is referred to as a normal period, hereinafter. The oscillation instruction signal Rt is in the off-state before the oscillation instruction unit 103 starts operating and after the oscillation instruction unit 103 stops operating. The oscillation instruction signal Rt is alternately output in the on-state and the off-state and this is repeated the same number of times as there are sets of filter parameter candidates, which are described below.

The velocity control unit 104 receives the velocity deviation Ve and the oscillation instruction signal Rt. During the normal period, the velocity control unit 104 calculates the sum of the proportional compensation resulting from multiplication of the velocity deviation Ve by a proportional gain, which is one of the control gains, and the integral compensation resulting from multiplication of the velocity deviation Ve by an integral gain, which is one of the control gains, and integration and outputs the result as a first operation signal u1. When the oscillation instruction signal Rt is changed to the on-state to start the oscillation period, the velocity control unit 104 outputs a constant value as the first operation signal u1, retaining a value immediately before the oscillation instruction signal Rt is changed to the on-state.

The operation to retain the immediately preceding value can be realized by, for example, retaining the output of the integration with the proportional gain and the integral gain at zero. This operation allows retention of the immediately preceding stable controlled state also during the oscillation period and stable transition to the oscillation period regardless of the degree of the load applied to the motor. Adjustment to be described below can thus be executed regardless of a presetting condition in the velocity control unit 104.

The oscillation forcing unit 105 configures a control loop CL0 in the oscillation period together with the filter unit 107, the current control unit 108, the motor 1, and the velocity calculation unit 101 and operates to cause the control loop in the oscillation period to oscillate during the oscillation period as described below. Specifically, the oscillation forcing unit 105 receives the velocity deviation Ve and the oscillation instruction signal Rt and outputs, during the oscillation period in which the oscillation instruction signal Rt is in the on-state, a second operation signal u2 that has an amplitude of predetermined magnitude and has a value the plus/minus sign of which is determined by a method described below. That is, the oscillation forcing unit 105 outputs a signal that results from calculation performed such that the signal has an amplitude of magnitude predetermined by nonlinear calculation based on the received velocity deviation Ve. Here, the amplitude of the second operation signal u2 is referred to as an operation amplitude Ca.

Specifically, a value of one of +Ua and −Ua is selected as the second operation signal u2 in accordance with the sign of the velocity deviation Ve. Here, a value of one of +Ua and −Ua may be selected in accordance with the sign of a signal resulting from the action of a low-pass filter on the velocity deviation Ve. Alternatively, a value of one of +Ua and −Ua may be selected not only in accordance simply with the sign of the velocity deviation Ve but also on the basis of a signal obtained by causing the velocity deviation Ve to have a nonlinear hysteresis characteristic.

The oscillation forcing unit 105 outputs the second operation signal u2 that has a value of zero during the normal period in which the oscillation instruction signal Rt is in the off-state.

An operation performed when the oscillation instruction signal Rt is in the on-state is described with reference to FIG. 2 next.

Figure 2:
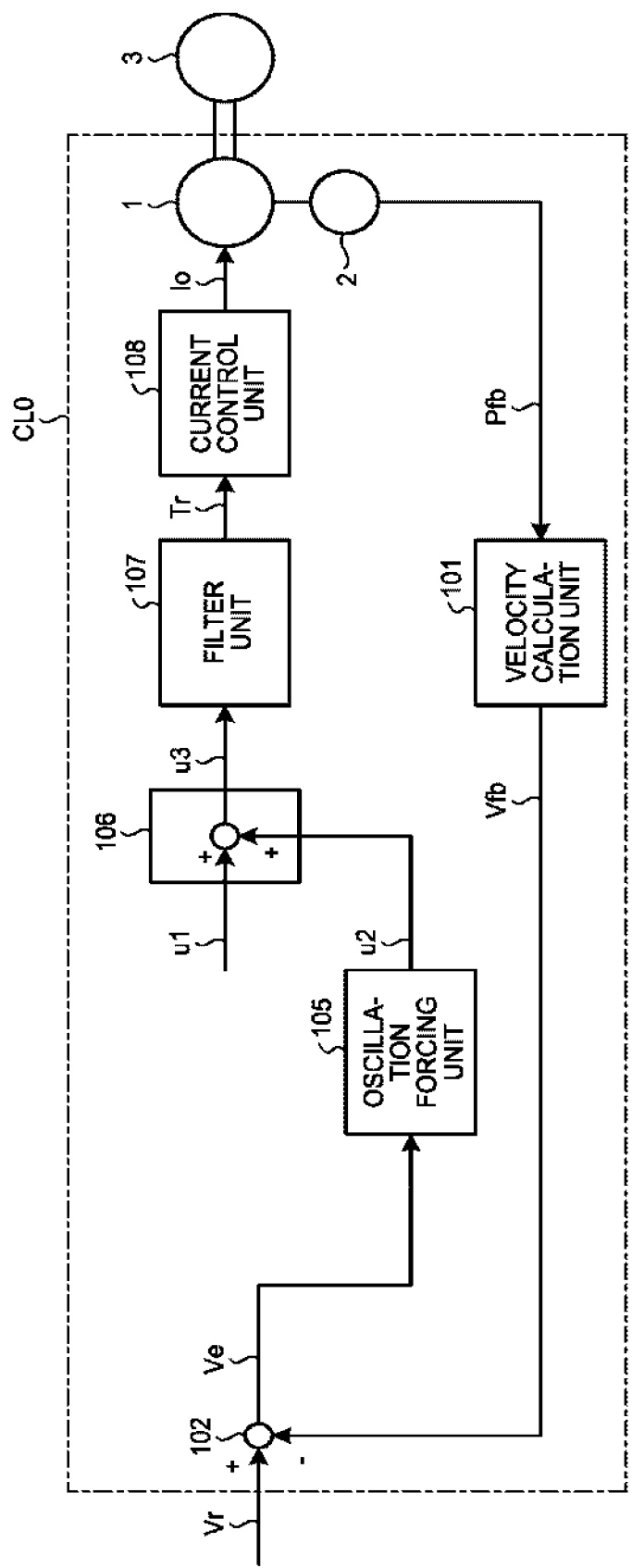
FIG. 2 is a block diagram illustrating a control loop in an oscillation period according to the first embodiment of the present invention.

FIG. 2 is a block diagram extracting and illustrating the control loop CL0 in the oscillation period, which is configured when the oscillation instruction signal Rt is in the on-state in the motor control apparatus 10 according to the first embodiment of the present invention. The control loop CL0 in the oscillation period is indicated by an alternate long and short dash line in FIG. 2. The control loop CL0 in the oscillation period includes the velocity calculation unit 101, the oscillation forcing unit 105, the filter unit 107, the current control unit 108, and the motor 1 in FIG. 2. In FIG. 2, the control loop CL0 in the oscillation period also includes the subtracter 102, the third-operation-signal output unit 106, and the motor position detector 2.

When the oscillation instruction signal Rt is changed to the on-state, the oscillation forcing unit 105 described above acts to cause the control loop CL0 in the oscillation period to oscillate. It is satisfactory if the control loop CL0 in the oscillation period includes the filter unit 107, the current control unit 108, the motor 1, the velocity calculation unit 101, and the oscillation forcing unit 105. A control loop in the oscillation period is configured similarly in each embodiment described below.

Here, the velocity deviation Ve and the second operation signal u2, which is output by the oscillation forcing unit 105, oscillate with a constant cycle. This oscillation is due to self-excited vibration, and the self-excited vibration is referred to as a limit cycle.

The second operation signal u2 oscillates with a predetermined amplitude in the present embodiment.

The operation described above of the oscillation forcing unit 105 performed during the oscillation period in which the oscillation instruction signal Rt is in the on-state is similar to an operation performed in a method referred to as a limit cycle method used in temperature adjustment control or the like.

The third-operation-signal output unit 106 receives the first operation signal u1 and the second operation signal u2, calculates the sum of the first operation signal u1 and the second operation signal u2, and outputs the result as a third operation signal u3. While the third-operation-signal output unit 106 outputs the third operation signal u3 resulting from the sum of the first operation signal u1 and the second operation signal u2 here, this is not a limitation. The third-operation-signal output unit 106 may select and output the first operation signal u1 as the third operation signal u3 when the oscillation instruction signal Rt is in the off-state. Alternatively, the third-operation-signal output unit 106 may select and output the second operation signal u2 as the third operation signal u3.

The filter unit 107 receives the third operation signal u3 and performs filtering processing in which the torque command Tr, which results from calculation performed with a filter acting on the third operation signal u3, is output. The filter of the filter unit 107 has a frequency characteristic defined on the basis a filter parameter Fp, and the frequency characteristic is variable in response to the filter parameter Fp.

As described above, the second operation signal u2 output by the oscillation forcing unit 105 has a value of zero during the normal period in which the oscillation instruction signal Rt is in the off-state. The filter unit thus performs the filtering processing on the first operation signal u1 to output the torque command Tr during the normal period.

The filter used for the calculation in the filter unit 107 according to the present embodiment is configured using the product of a low-pass filter and a notch filter. Here, filter parameters Fp include a notch frequency wn, which is the frequency at the center of the notch filter; a factor za and a factor zb, which respectively define the width (band width) and the depth (attenuation amplitude) of the notch filter; and a cutoff frequency w1 of the low-pass filter. The filter parameters Fp also include a switch that enables or disables the notch filter and a switch that enables or disables the low-pass filter. Here, when the notch filter is in a disabled state, its transfer function is one. Similarly, when the low-pass filter is in the disabled state, its transfer function is one.

The transfer function LPF of the low-pass filter in an enabled state and the transfer function NE of the notch filter in the enabled state are expressed by the filter parameters Fp as in equations (1) and (2), respectively.

[Formula 1]
$$LPF = \frac{w1}{s + w1} \quad (1)$$

[Formula 2]
$$NF = \frac{s^2 + 2*zb*wn*s + wn^2}{s^2 + 2*za*wn*s + wn^2} \quad (2)$$

Here, s represents a Laplace operator.

While the factors of a continuous system transfer function serve as the filter parameters Fp here, factors of a discrete system transfer function may serve as the filter parameters Fp. Additionally, the filter may have other configurations as long as the frequency characteristic of the filter is defined on the basis a parameter. For example, two or more low-pass filters may be placed in series, or another type of filter such as a phase-lead filter or a phase-delay filter may be used.

The current control unit 108 receives the torque command Tr and supplies the motor 1 with the current Io for generating torque in accordance with the torque command Tr. The motor 1 is controlled in this manner.

The amplitude evaluation unit 109 evaluates an oscillation state of the control loop CL0 in the oscillation period described above; particularly, the amplitude evaluation unit 109 performs evaluation related to the amplitude of a signal of the control loop CL0 in the oscillation period. Specifically, the amplitude evaluation unit 109 receives the velocity deviation Ve, which is input to the oscillation forcing unit 105, and the second operation signal u2, which is output from the oscillation forcing unit 105, and acquires a velocity amplitude Va that is the amplitude of the velocity deviation Ve and the operation amplitude Ua of the second operation signal u2. Here, the second operation signal u2 is a rectangular wave signal based on the operation of the oscillation forcing unit 105; thus, the operation amplitude Ua can be acquired by obtaining the absolute value of the second operation signal u2. As a method to calculate the velocity amplitude Va, a maximum value of the absolute value of the signal provided during a period from when the sign of the velocity deviation Ve changes until when the sign changes next may be calculated as the velocity amplitude Va.

Alternatively, a signal having a maximum spectrum obtained by performing a fast Fourier transform (FFT) on the velocity deviation Ve described above may be the velocity amplitude Va. Alternatively, a signal resulting from the action of a low-pass filter on one of the signals described above may be the velocity amplitude Va.

The amplitude evaluation unit 109 also calculates the ratio of the velocity amplitude Va to the operation amplitude Ua as an evaluation value Ev. Specifically, the amplitude evaluation unit 109 calculates a value resulting from division of the velocity amplitude Va by the operation amplitude Ua as the evaluation value Ev. That is, Ev=Va/Ua. The amplitude evaluation unit 109 outputs the evaluation value Ev that is obtained immediately before the oscillation instruction signal Rt is changed from the on-state to the off-state. Note that this method of obtaining the evaluation value Ev is not a limitation. For example, the operation amplitude Ua has predetermined magnitude and the value of the ratio of the velocity amplitude Va to the operation amplitude Ua depends only on the velocity amplitude Va in the present embodiment; thus, the velocity amplitude Va may be simply used as the evaluation value Ev. It is needless to say that the amplitude evaluation unit 109 does not have to have the second operation signal u2 as the input signal in this case.

Alternatively, a value obtained by the action of a low-pass filter on a value resulting from division of the velocity amplitude Va by the operation amplitude Ua may be used as the evaluation value Ev. As described below, the evaluation value Ev calculated here represents boundary magnitude of a velocity control band that depends on the characteristic of the filter unit 107 and is a value for evaluating a filter parameter Fp that is set in the filter unit 107.

The filter adjustment unit 110 retains multiple sets of filter parameter candidates, which are candidates for the filter parameters Fp of the filter unit 107, and sets the candidates in the filter unit 107 in a predetermined sequence. One set of filter parameter candidates is set in the filter unit 107 in the predetermined sequence during the normal period in which the oscillation instruction signal Rt is in the off-state. The filter adjustment unit 110 also receives the evaluation value Ev as an input signal and stores the filter parameters Fp that are set in the filter unit 107 in association with the evaluation value Ev.

The filter adjustment unit 110 sets the retained filter parameter candidates in the filter unit 107 in the predetermined sequence and acquires each associated evaluation value Ev.

The filter adjustment unit 110 compares the acquired evaluation values Ev sequentially and stores the smaller evaluation value Ev so as to obtain a minimized evaluation value Ev. The filter adjustment unit 110 selects filter parameter candidates that are associated with the minimized evaluation value Ev as optimal filter parameters and sets the optimal filter parameters in the filter unit 107.

Here, it is satisfactory if one set of optimal filter parameters is obtained finally; thus, the filter adjustment unit 110 does not necessarily need to store all the filter parameter candidates and all the evaluation values Ev associated with the filter parameter candidates. The filter adjustment unit 110 may sequentially compare a newly acquired evaluation value Ev to an evaluation value Ev that has been found the smallest in each stage and store the smaller evaluation value Ev and its associated filter parameter candidates.

An arrow extending from the filter adjustment unit 110 and passing through the filter unit 107 diagonally in FIG. 1 signifies that the filter adjustment unit 110 changes a setting in the filter unit 107. The same is applied to the block diagrams in the embodiments described below.

An effect produced by the motor control apparatus 10 according to the present embodiment is described next.

An effect produced by including the oscillation forcing unit 105 and the amplitude evaluation unit 109 as constituent elements is described first. The motor control apparatus 10 performs velocity feedback control such that the velocity of the motor 1 approaches the velocity command Vr for the motor during the normal period in which the oscillation instruction signal Rt is in the off-state. The oscillation forcing unit 105 operates to cause the self-excited vibration referred to as the limit cycle as described above during the oscillation period in which the oscillation instruction signal Rt is in the on-state. That is, the oscillation forcing unit 105 configures the control loop CL0 in the oscillation period together with the filter unit 107, the current control unit 108, the motor 1, and the velocity calculation unit 101 and causes the control loop CL0 in the oscillation period to oscillate.

Upon starting its operation on the basis of an operation external to the mechanical system, the oscillation instruction unit 103 outputs the oscillation instruction signal Rt, and the limit cycle is caused. The boundary magnitude of the velocity control band of the velocity control unit 104, which varies depending on the frequency characteristic of the filter unit 107, can be determined on the basis of the waveform of the limit cycle caused by the operation of the oscillation forcing unit 105. Specifically, the boundary magnitude of the velocity control band of the velocity control unit 104 can be determined on the basis of the ratio of the amplitude of the input signal to the amplitude of the output signal to/from the oscillation forcing unit 105. The boundary magnitude of the velocity control band here refers to the magnitude of the control band realized when a control gain of the velocity control unit 104 is maximized within a range where the stability is maintained.

The reason for it is described below. With the oscillation forcing unit 105 regarded as a controller, a target that receives the third operation signal u3 and outputs the velocity signal Vfb can be viewed as a control target with respect to the oscillation forcing unit 105. This control target is referred to as a control target P0 for explanatory purposes. Constituent elements included in the control target P0 are surrounded by a broken line in FIG. 1. As illustrated in FIG. 1, the control target P0 includes the filter unit 107. The control target P0 is used in the embodiments described below on the basis of a concept similar to the concept in the present embodiment.

The limit cycle, which is caused on the basis of the operation of the oscillation forcing unit 105, oscillates in a steady state with a frequency having a phase delayed by 180 degrees in the open loop characteristic of a transfer function of the control target P0. Here, the frequency having the phase of the transfer function of the control target P0 delayed by 180 degrees is defined as a frequency wP0. The frequency wP0 is referred to as a phase crossover frequency. A gain of the control target P0 with the frequency wP0 is defined as a gain gP0. The gain gP0 in the phase crossover frequency is an important value for evaluating a maximum value of the proportional gain of the velocity control unit 104 that varies depending on the frequency characteristic of the control target P0.

With the oscillation instruction signal Rt in the off-state and the velocity control being performed by the velocity control unit 104, increasing the proportional gain from a state in which the velocity control is stable causes steady-state vibration when the proportional gain reaches a specific value Kpu. This specific value Kpu is referred to as a boundary proportional gain. Here, a control-system one-round loop gain with the frequency wP0 is one, and the boundary proportional gain Kpu and the gain gP0 described above satisfy the following equation (3).

[Formula 3]

$$Kpu = \frac{1}{gP0} \quad (3)$$

That is, when the magnitude of the gain gP0 is identified, the boundary proportional gain Kpu can be calculated using equation (3).

The gain gP0 is, by its definition, a value resulting from division of the amplitude of the velocity deviation Ve, which is an output signal provided when a sinusoidal signal with the frequency wP0 is input as the second operation signal u2 to the control target P0, by the amplitude of the second operation signal u2. The rectangular wave signal with the frequency wP0 is input as the second operation signal u2 to the control target P0 in the limit cycle, which is caused by the oscillation forcing unit 105. That is, in the limit cycle, which is caused by the oscillation forcing unit 105, the calculation to obtain the evaluation value Ev, which results from the division of the velocity amplitude Va by the operation amplitude Ua, is equivalent to calculation of the gain gP0, except that the second operation signal u2 is a rectangular wave signal.

The amplitude of the rectangular wave signal can be approximately replaced by the amplitude of the sinusoidal signal on the basis of a describing function method described below. That is, the evaluation value Ev, which is the ratio of the velocity amplitude Va to the operation amplitude Ua, is a good index indicative of the gain gP0.

The evaluation value Ev, which is calculated by the amplitude evaluation unit 109, and the gain gP0 satisfy the following relation.

[Formula 4]

$$gP0 = c*Ev \quad (4)$$

Here, a constant c is a constant that is defined on the basis of the describing function method. The constant c is a conversion factor for approximately replacing the rectangular wave signal with the sinusoidal signal on the basis of the describing function method. In the describing function method, the constant c can be calculated on the basis of a main-component factor when Fourier series expansion is performed on input/output signals. Specifically, the constant c ranges from 0.5 to 2.0.

When the operation amplitude Pa is constant, a value resulting from multiplication of the velocity amplitude Va by c1 agrees with the gain gP0 on the basis of equation (4), where the constant c1 is newly defined as c1=c/Ua. Thus, when the operation amplitude Ua has constant magnitude and the velocity amplitude Va is used as the evaluation value Ev as described above, the evaluation value Ev is proportional to the gain gP0, serving as a good index.

The boundary proportional gain Kpu and the evaluation value Ev satisfy the following relationship on the basis of equations (3) and (4).

[Formula 5]

$$Kpu = \frac{1}{c * Ev} \quad (5)$$

In other words, the boundary proportional gain Kpu of the velocity control unit 104 in accordance with the frequency characteristic of the filter unit 107 can be estimated by acquiring the evaluation value Ev. When the proportional gain is adjusted to a large value, the velocity control unit 104 has a large control band and thus has favorable control performance; however, the proportional gain needs to be adjusted to a range smaller than the boundary proportional gain Kpu in order to maintain the stability of the velocity control. The value of the boundary proportional gain Kpu serves as a value that determines an upper limit of the velocity control band. The magnitude of the boundary proportional gain Kpu takes different values depending on the frequency characteristic of the control target P0. In particular, when the mechanical system has a resonance characteristic, the value of the boundary proportional gain Kpu significantly depends on the frequency characteristic of the filter unit 107.

By adjusting the frequency characteristic of the filter unit 107 to thereby maximize the boundary proportional gain Kpu of the velocity control unit 104, maximization of an adjustable range of the proportional gain of the velocity control unit 104 is realized, thereby enabling maximization of the control band in the velocity control. As described above, determining the boundary proportional gain Kpu is beneficial in the adjustment of the frequency characteristic of the filter unit 107.

As described above, as a result of the limit cycle caused by the operation of the oscillation forcing unit 105, the ratio of the amplitude of the input signal to the amplitude of the output signal to/from the oscillation forcing unit 105 serves as a value that indicates the boundary proportional gain Kpu of the velocity control unit 104.

That is, by determining the ratio of the amplitude of the input signal to the amplitude of the output signal to/from the oscillation forcing unit 105, the boundary proportional gain Kpu of the velocity control unit 104 can be determined with ease.

In the case of a mechanical system, the operation of the oscillation forcing unit 105 described above generates the limit cycle at frequencies from a few tens of Hz to several thousands of Hz; thus, the evaluation value Ev can be acquired by generating the limit cycle for a short time of less than one second. Without the oscillation forcing unit 105, a task of gradually increasing the proportional gain by trial and error while taking measurements such as the velocity signal Vfb, which is the output, would be needed to determine the boundary proportional gain Kpu.

The operations of the oscillation forcing unit 105 and the amplitude evaluation unit 109 eliminate the need to gradually increase the proportional gain by trial and error to determine the boundary proportional gain Kpu as described above, thereby removing the burden of trial and error.

Additionally, using the oscillation forcing unit 105 and the amplitude evaluation unit 109 enables estimation of the boundary proportional gain Kpu in a short time of less than one second in the case of a mechanical system.

Thus, by including the oscillation forcing unit 105 and the amplitude evaluation unit 109 as constituent elements, the boundary magnitude of the velocity control band in accordance with the frequency characteristic of the filter unit 107 can be determined with ease.

An effect of the motor control apparatus 10, produced by including the filter adjustment unit 110 as a constituent element, is described next with reference to FIG. 3.

Figure 3:
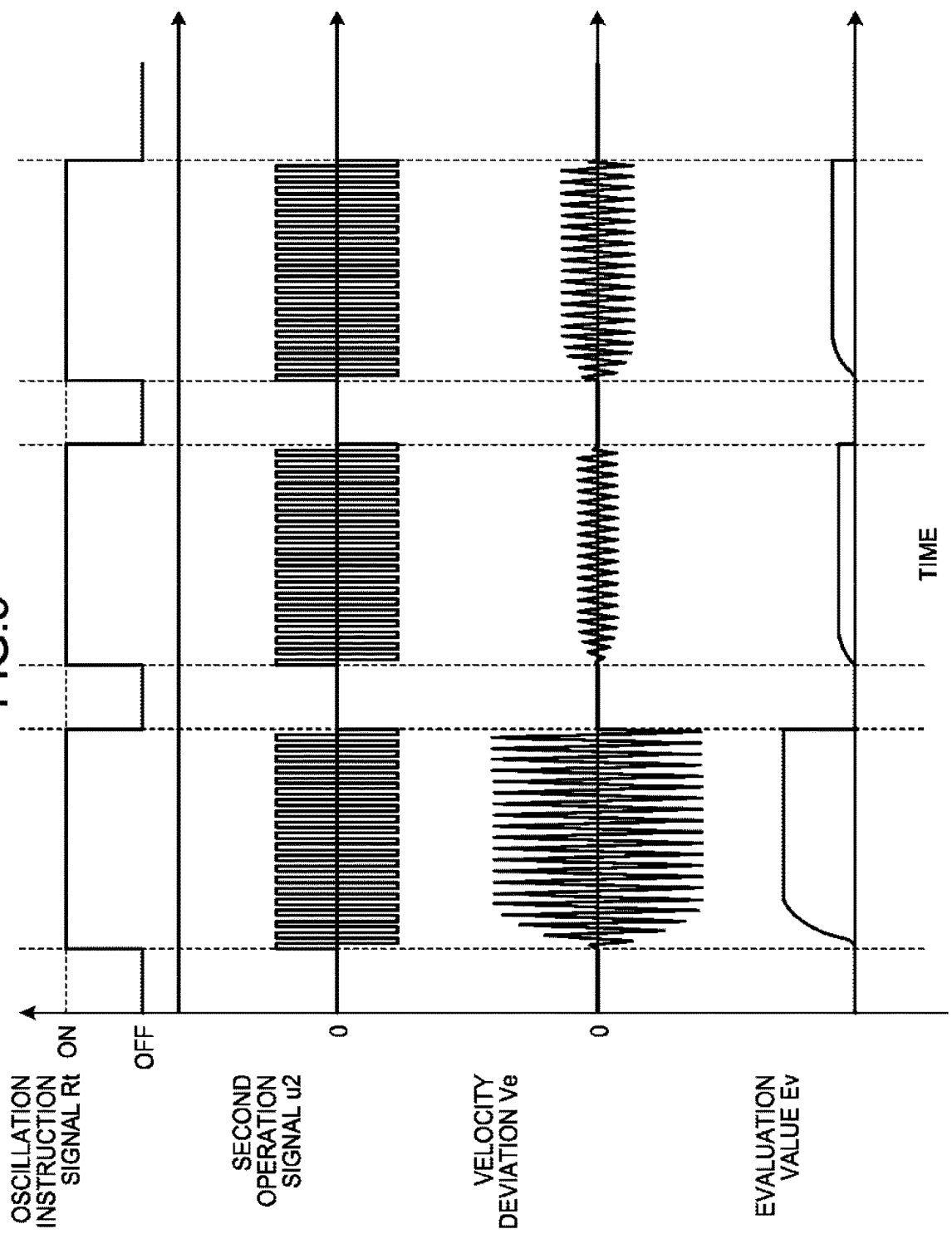
FIG. 3 is a time response graph illustrating a behavior of the motor control apparatus according to the first embodiment of the present invention.

FIG. 3 is a time response graph illustrating a behavior of the motor control apparatus 10 according to the first embodiment of the present invention. In FIG. 3, from the upper section, the oscillation instruction signal Rt, the second operation signal u2, the velocity deviation Ve, and the evaluation value Ev are illustrated. In an example illustrated here, small values are set as the proportional gain and the integral gain in the velocity control unit 104 and thus the velocity control is not unstable. It is assumed that, for the sake of simplicity, the filter adjustment unit 110 retains three sets of filter parameter candidates.

These filter parameter candidates are referred to as a first set of filter parameter candidates, a second set of filter parameter candidates, and a third set of filter parameter candidates, in the sequence of being set in the filter unit 107. As described above, the operation of the oscillation instruction unit 103 is started on the basis of an operation external to the mechanical system. In this example, the oscillation instruction unit 103 outputs an on-state signal as the oscillation instruction signal Rt three times in order to evaluate the three sets of filter parameter candidates.

The filter adjustment unit 110 first sets the first set of filter parameter candidates in the filter unit 107 during the normal period in which the oscillation instruction signal Rt is in the off-state before the operation of the oscillation instruction unit 103 is started. Here, the frequency characteristic of the filter unit 107 is defined on the basis of the first set of filter parameter candidates.

When the operation of the oscillation instruction unit 103 is started on the basis of an operation external to the mechanical system and the oscillation instruction signal Rt is changed to the on-state, the self-excited vibration, which is referred to as the limit cycle, is generated on the basis of the operation of the oscillation forcing unit 105 as described above. This self-excited vibration causes the second operation signal u2 and the velocity deviation Ve to oscillate, and the amplitude evaluation unit 109 calculates an evaluation value Ev. The filter adjustment unit 110 stores the evaluation value Ev that is obtained at this time in association with the first set of filter parameter candidates.

The second set of filter parameter candidates is set in the filter unit 107 during the normal period that takes place after the first oscillation period is finished. When the oscillation instruction signal Rt is changed to the on-state, the self-excited vibration, which is referred to as the limit cycle, is generated again, and the amplitude evaluation unit 109 calculates another evaluation value Ev. The filter adjustment unit 110 stores the evaluation value Ev that is obtained at this time in association with the second set of filter parameter candidates. The third set of filter parameter candidates is also set in the filter unit 107, and, then, the limit cycle is generated; the filter adjustment unit 110 stores the evaluation value Ev that is obtained at this time in association with the third set of filter parameter candidates.

In the manner described above, the evaluation value Ev is calculated for each of the multiple sets of filter parameter candidates that are retained by the filter adjustment unit 110. As described above, it is possible, by using the evaluation value Ev calculated by the amplitude evaluation unit 109, to determine the boundary magnitude of the velocity control band that is in accordance with the frequency characteristic of the filter unit 107, which is defined based on each set of filter parameter candidates.

FIG. 4 is a diagram illustrating examples of filter parameter candidates and values of the evaluation value Ev that are retained in the filter adjustment unit 110. The values illustrated in FIG. 4 are provided just as examples and are not limitations on a value to be selected as a filter parameter candidate. In this example, when the second set of filter parameter candidates is set in the filter unit 107, the smallest evaluation value Ev is obtained. Here, the second set of filter parameter candidates is referred to as optimal filter parameters.

In other words, adjustment in which the second set of filter parameter candidates is set in the filter unit 107 can maximize the boundary proportional gain Kpu; it can be said that this is the filter adjustment that can maximize the velocity control band. When the evaluation of the three sets of filter parameter candidates is finished, the filter adjustment unit 110 sets the second set of filter parameter candidates, which are associated with the minimized evaluation value Ev in this example, in the filter unit 107.

As described above, a filter parameter Fp that maximizes the velocity control band is selected and set in the filter unit 107 on the basis of the operation of the filter adjustment unit 110 from the retained filter parameter candidates.

As described above, the evaluation of the filter parameter candidates is finished in a short time because of the operation of the oscillation forcing unit 105. In particular, the evaluation of one set of filter parameter candidates is finished in less than one second in the case of a mechanical system. While three sets of filter parameter candidates are assumed for the sake of simplicity here, for example, adjustment can still be finished in a short time of less than 100 seconds even if the number of filter parameter candidates is 100.

As described above, the motor control apparatus 10, which includes the filter adjustment unit 110 as a constituent element, can retain multiple sets of filter parameter candidates. Adjustment of the filter unit 107 that maximizes the velocity control band is enabled by selecting, from the filter parameter candidates, an optimal filter parameter that minimizes the evaluation value Ev.

Additionally, use of the evaluation value Ev by the filter adjustment unit 110 enables evaluation of the amplitude of vibration in all the frequency bands. Thus, even if vibration in a low frequency band is generated when the notch filter is set, its amplitude can still be evaluated. That is, the operation of the filter adjustment unit 110 does not cause degradation in stability in a low frequency band.

Additionally, the filter adjustment unit 110 can retain multiple filter parameter candidates and thus can change the frequency characteristic of the filter unit 107 continuously and also change the frequency characteristic of the filter unit 107 discretely.

In a general gradient method, search for a parameter is performed in a direction in which the gradient of an evaluation value is negative so that the evaluation value decreases, and the search is finished when the gradient of the evaluation reaches zero where a locally optimal solution is obtained; thus, this method may end up reaching the locally optimal solution. In contrast, the filter adjustment unit 110 according to the present embodiment operates to change filter parameters Fp independently of the gradient of the evaluation value Ev and hence does not end up reaching a locally optimal solution unlike the above case.

Another conceivable method is to retain two sets of filter parameter candidates and select one of the sets of filter parameter candidates that realizes the smaller evaluation value Ev. In this case, the search is finished when one of the evaluation values Ev becomes smaller than the other.

It is possible to retain and evaluate, not only the notch frequency wn, but also the depth and width of the notch filter as filter parameter candidates. That is, the filter adjustment unit 110 can operate to adjust also the depth and width of the notch filter.

Additionally, the filter adjustment unit 110 adjusts the frequency characteristic of the filter unit 107 on the basis of the value of the evaluation value Ev, which is the ratio of the velocity amplitude Va to the operation amplitude Ua, as described above. The adjustment, thus, does not necessarily results in agreement of the notch frequency wn of the notch filter with the resonance frequency; adjustment that maximizes the velocity control band on the basis of various alternatives can be realized.

Additionally, by including the oscillation forcing unit 105 and the filter adjustment unit 110 as constituent elements, the limit cycle can be generated and filter parameter candidates can be evaluated regardless of a presetting condition in the velocity control unit 104. Specifically, filter parameter candidates can be evaluated regardless of the value of a control gain set in the velocity control unit 104, and, thus, adjustment that maximizes the velocity control band can be realized. That is, the adjustment can be executed regardless of a presetting condition in the velocity control unit 104.

In the configuration described above, an example is described in which an off-state period is provided when the limit cycle is not generated, by using the oscillation instruction signal Rt that is alternately output in the on-state and the off-state a predetermined number of times. The off-state is, however, not necessarily needed in the middle of adjustment. Specifically, the oscillation instruction signal Rt can be configured such that, once it is changed to the on-state, it generates the limit cycle continuously until the evaluation of filter parameter candidates is finished. In this case, filter parameters Fp can be changed after the elapse of a predetermined time.

While the velocity control unit 104 calculates the first operation signal u1 from the sum of the proportional compensation and the integral compensation in the description provided above, this is not a limitation on the method to calculate the first operation signal u1 in the velocity control unit 104. For example, the first operation signal u1 may be calculated from calculation based on proportional integral differential (PID) control, which also includes derivative compensation.

While the velocity signal Vfb is calculated on the basis of the position signal Pfb, which is detected by the motor position detector 2, in the present embodiment, the velocity signal Vfb may be obtained from a velocity detector that is attached to the motor 1 to detect the velocity of the motor. Alternatively, the velocity signal Vfb may be obtained by estimating the velocity of the motor 1 from the current and voltage of the motor 1.

The amplitude evaluation unit 109 receives the velocity deviation Ve as an input signal and calculates the amplitude of the velocity deviation Ve as the velocity amplitude Va in the configuration described above. Alternatively, the amplitude evaluation unit 109 can receive the velocity signal Vfb as the input signal and calculate the amplitude of the velocity signal Vfb as the velocity amplitude Va and this is substantially equivalent to evaluating the amplitude of the velocity deviation Ve. That is, the velocity deviation Ve does not have to be directly used as long as the amplitude of the velocity deviation Ve is substantially evaluated.

While the amplitude evaluation unit 109 receives the second operation signal u2 as an input signal and calculates the amplitude of the second operation signal u2 as the operation amplitude Ua in the configuration described above, the amplitude evaluation unit 109 may receive the third operation signal u3 as the input signal and calculate the amplitude of the third operation signal u3 as the operation amplitude Ua.

While it is assumed for explanatory purposes that the filter adjustment unit 110 retains three sets of filter parameter candidates, this is not a limitation. If there are four or more sets of filter parameter candidates, filter parameters that can maximize the velocity control band can be selected and set in the filter unit 107 on the basis of the operation of the filter adjustment unit 110 as in the case described above. If there are two filter parameter candidates, the effect of enabling selection of a filter that can heighten the velocity band in a short time can be produced similarly. It is needless to say that filter parameter candidates include those that have a direct delivery characteristic and cause the filter unit 107 to output an input as it is.

In the description provided above, the amplitude evaluation unit 109 acquires a value resulting from division of the velocity amplitude Va by the operation amplitude Pa as the evaluation value Ev and thereby can estimate the boundary proportional gain Kpu of the velocity control unit 104 in accordance with the frequency characteristic of the filter unit 107.

This is not a limitation on the method of obtaining the evaluation value Ev for estimating the boundary proportional gain Kpu of the velocity control unit 104 in accordance with the frequency characteristic of the filter unit 107.

For example, a value resulting from division of the operation amplitude Ua by the velocity amplitude Va, which is the inverse of the evaluation value Ev described above, may be used as the evaluation value. When the evaluation value in this case is referred to as Ev1, Ev1=Ua/Va is satisfied. The boundary proportional gain Kpu can be acquired as a value resulting from division of the evaluation value Ev1 by the constant c described above.

Acquiring the maximum value of the evaluation value Ev1 is equivalent to acquiring the minimum value of the evaluation value Ev; thus, in selecting an optimal filter parameter, a filter parameter Fp that is used when the maximum value of the evaluation value Ev1 is obtained may be the optimal filter parameter.

While the amplitude evaluation unit 109 acquires the second operation signal u2 as an input signal, the amplitude evaluation unit 109 may acquire the torque command Tr as the input signal.

When the torque command Tr is acquired by the amplitude evaluation unit 109 as the input signal, the amplitude evaluation unit 109 may obtain, as the operation amplitude Ua, an amplitude of a signal resulting from the action of a transfer function that is an inverse model of a filter of the filter unit 107 on the received torque command Tr.

The amplitude of the signal resulting from the action of a transfer function that is an inverse model of the filter of the filter unit 107 on the torque command Tr has magnitude equivalent to the magnitude of the amplitude of the second operation signal u2; thus, the amplitude evaluation unit 109 can acquire an evaluation value equivalent to the evaluation value Ev described above.

Similarly, the amplitude evaluation unit 109 may receive the current Io as the input signal. When the current Io is received as the input signal, an evaluation value equivalent to the evaluation value Ev described above can be obtained by using inverse models of the filter unit 107 and the current control unit 108.

Additionally, the first operation signal u1, which is the output of the velocity control unit 104, may be used as an input to the oscillation forcing unit 105 in place of the velocity deviation Ve in the description provided above. In this case also, the oscillation forcing unit 105 configures the control loop CL0 in the oscillation period together with the filter unit 107, the current control unit 108, the motor 1, and the velocity calculation unit 101 during the oscillation period in which the oscillation instruction signal Rt is in the on-state. The oscillation forcing unit 105 operates to cause the control loop CL0 in the oscillation period to oscillate.

It is needless to say that the oscillation forcing unit 105 operates similarly to the operation described above if, for example, in the oscillation forcing unit 105 that has received the first operation signal u1, a signal resulting from division of the first operation signal u1 by the proportional gain of the velocity control unit 104 is obtained and substituted into the velocity deviation Ve.

The motor control apparatus 10 according to the present embodiment operates as described above. That is, when the operation of the oscillation instruction unit 103 is started on the basis of an operation external to the mechanical system, each of the multiple sets of filter parameter candidates is set in the filter unit 107 in turn, and thereby the boundary magnitude of the velocity control band in accordance with the frequency characteristic of the filter unit 107 can be determined with ease. Additionally, filter parameter candidates that maximize the velocity control band can be selected from the multiple sets of filter parameter candidates, and the frequency characteristic of the filter unit 107 can be thereby adjusted.

The present embodiment can provide a motor control apparatus that enables filter adjustment that maximizes a velocity control band with ease regardless of a presetting condition of a control gain in the velocity control unit and without the burden of trial and error.

Second Embodiment

The motor control apparatus 10 according to the first embodiment selects a filter parameter candidate that maximizes the velocity control band and thereby adjusts the filter unit. In the present embodiment, a motor control apparatus is described that can perform adjustment of a velocity control unit together with adjustment of the filter unit.

Figure 5:
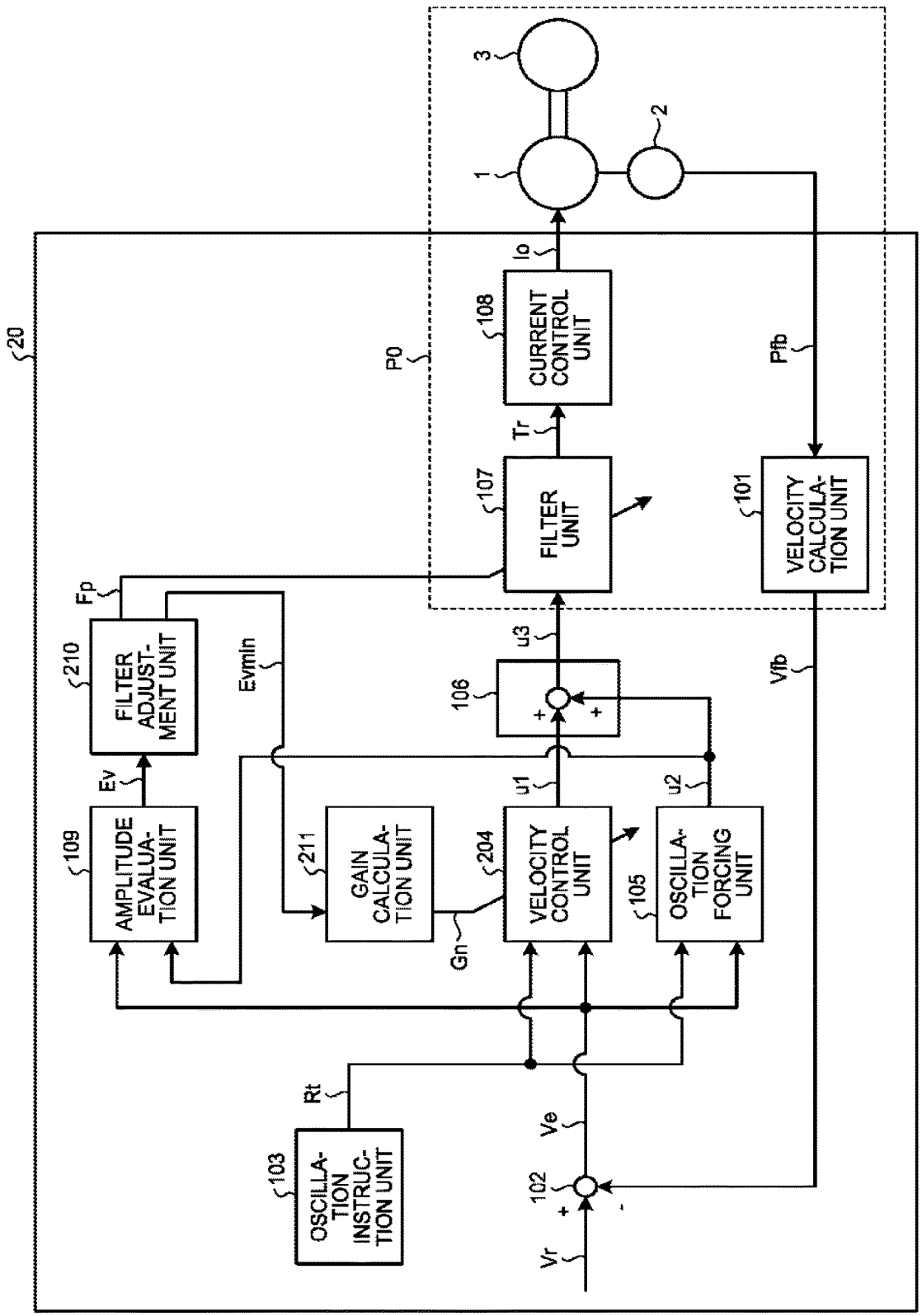
FIG. 5 is a block diagram illustrating a configuration of a motor control apparatus according to a second embodiment of the present invention.

FIG. 5 is a block diagram illustrating a configuration of a motor control apparatus 20 according to a second embodiment.

The motor control apparatus 20 includes, as its constituent elements, the velocity calculation unit 101, the subtracter 102, the oscillation instruction unit 103, a velocity control unit 204, the oscillation forcing unit 105, the third-operation-signal output unit 106, the filter unit 107, the current control unit 108, the amplitude evaluation unit 109, a filter adjustment unit 210, and a gain calculation unit 211.

As in the first embodiment, a portion that receives the third operation signal u3 and outputs the velocity signal Vfb is referred to as the control target P0 and is indicated by a broken-line box in FIG. 5. The control target P0 can be viewed as a control target of the oscillation forcing unit 105 when the oscillation forcing unit 105 is regarded as a controller.

The control loop CL0 in the oscillation period is configured similarly to that in the first embodiment. That is, the control loop CL0 in the oscillation period includes the velocity calculation unit 101, the oscillation forcing unit 105, the filter unit 107, the current control unit 108, and the motor 1. As in the first embodiment, the control loop CL0 in the oscillation period also includes the subtracter 102, the third-operation-signal output unit 106, and the motor position detector 2.

In FIG. 5, the portions that are identical to those in the first embodiment are assigned symbols identical to the symbols in the first embodiment, and a detailed description thereof is omitted below.

An operation of the motor control apparatus 20 according to the present embodiment is described next.

As in the first embodiment, the oscillation instruction unit 103 outputs the oscillation instruction signal Rt, which indicates the on-state or the off-state.

The velocity control unit 204 receives the velocity deviation Ve and the oscillation instruction signal Rt. During the normal period, in which the oscillation instruction signal Rt is in the off-state, the velocity control unit 204 calculates the sum of the proportional compensation, which results from the multiplication of the velocity deviation Ve by the proportional gain, which is one of the control gains, and the integral compensation, which results from the multiplication of the velocity deviation Ve by the integral gain, which is one of the control gains, and the integration and outputs the result as the first operation signal u1. When the oscillation instruction signal Rt is changed to the on-state to start the oscillation period, the first operation signal u1, which is the output of the velocity control unit 204, is a constant value that is a value retained from immediately before the oscillation instruction signal Rt is changed to the on-state. The operation to retain the immediately preceding value can be realized by, for example, retaining the output of the integration with the proportional gain and the integral gain at zero. This allows retention of the immediately preceding stable controlled state also during the oscillation period and stable transition to the oscillation period regardless of the degree of the load applied to the motor.

When the oscillation instruction signal Rt is changed to the on-state to start the oscillation period, the stable transition to the oscillation period is realized regardless of magnitude of the control gains preset in the velocity control unit 204. The adjustment can thus be executed regardless of a presetting condition in the velocity control unit 204.

The proportional gain and the integral gain used in the calculation in the velocity control unit 204 are variable values; here, they are changed on the basis of a control gain signal Gn. The control gain signal Gn is a signal that includes information on the values of the proportional gain and the integral gain.

The filter adjustment unit 210 retains, for example, 100 sets of filter parameter candidates, which are candidates for the filter parameters Fp of the filter unit 107, and sets the candidates in the filter unit 107 in a predetermined sequence. One set of filter parameter candidates is set in the filter unit 107 in the predetermined sequence during the normal period in which the oscillation instruction signal Rt is in the off-state. The filter adjustment unit 210 also receives the evaluation value Ev, which is the ratio of the velocity amplitude Va to the operation amplitude Ua, as an input signal and stores the filter parameter candidates that are set in the filter unit 107 in association with the evaluation value Ev.

The filter adjustment unit 210 sets the retained filter parameter candidates in the filter unit 107 in turn and acquires each associated evaluation value Ev.

The filter adjustment unit 210 compares the acquired evaluation values Ev sequentially and stores the smaller one so as to obtain a minimized evaluation value Ev. The filter adjustment unit 210 selects filter parameter candidates that are associated with the minimized evaluation value Ev as optimal filter parameters and sets the optimal filter parameters in the filter unit 107.

Here, it is satisfactory if one set of optimal filter parameters is obtained finally; thus, all the filter parameter candidates and all the evaluation values Ev associated with the filter parameter candidates do not necessarily need to be stored. The filter adjustment unit 210 may sequentially compare a newly acquired evaluation value Ev to an evaluation value Ev that has been found the smallest in each stage and store the smaller evaluation value Ev and its associated filter parameter candidates.

After acquiring the evaluation values Ev that are each associated with the filter parameter candidates, the filter adjustment unit 210 selects an evaluation value Ev that has the minimum value from the acquired multiple evaluation values Ev and outputs the result as a minimum evaluation value Evmin.

The gain calculation unit 211 receives the minimum evaluation value Evmin as an input signal. When receiving the minimum evaluation value Evmin, the gain calculation unit 211 calculates a proportional gain that results from multiplication of the inverse of the minimum evaluation value Evmin by a predetermined value as described below. The gain calculation unit 211 also calculates an integral gain on the basis of magnitude of the velocity control band that is determined on the basis of the magnitude of the proportional gain. The gain calculation unit 211 outputs the information on the values of the proportional gain and the integral gain as the control gain signal Gn.

An effect produced by the motor control apparatus 20 according to the present embodiment is described below.

An operation of the filter adjustment unit 210 in the motor control apparatus 20 is similar to the operation of the filter adjustment unit 110 according to the first embodiment, except that the filter adjustment unit 210 outputs a minimized evaluation value Ev as the minimum evaluation value Evmin. The effect produced based on the operations of the oscillation forcing unit 105, the amplitude evaluation unit 109, and the filter adjustment unit 210 is thus similar to that of the first embodiment.

The motor control apparatus 20 can determine with ease the velocity control band in accordance with the frequency characteristic of the filter unit 107 exhibited when each of the multiple sets of filter parameter candidates is set in the filter unit 107 in turn. The motor control apparatus 20 can also select filter parameter candidates that maximize the velocity control band from the multiple sets of filter parameter candidates and thereby adjust the frequency characteristic of the filter unit 107.

An effect produced by adding the gain calculation unit 211 is described next. After the evaluation of the multiple sets of filter parameter candidates on the basis of the operation of the filter adjustment unit 210 is finished, the frequency characteristic of the filter unit 107 is adjusted. Additionally, the gain calculation unit 211 receives the minimum evaluation value Evmin. The minimum evaluation value Evmin and the boundary proportional gain Kpu of the velocity control unit 204 in accordance with the frequency characteristic of the filter unit 107 obtained at this time satisfy the following equation (6).

[Formula 6]

$$Kpu = \frac{1}{c * Evmin} \quad (6)$$

The gain calculation unit 211 can thus calculate, from the received minimum evaluation value Evmin, the boundary proportional gain Kpu that is in accordance with the adjusted frequency characteristic of the filter unit 107. Additionally, the proportional gain is obtained by multiplying the boundary proportional gain Kpu by a constant γ that is greater than zero and smaller than one. The proportional gain resulting from the multiplication of the boundary proportional gain Kpu by the constant γ has a value smaller than the value of the boundary proportional gain Kpu; thus, velocity control that maintains stability can be realized.

Setting the proportional gain using, for example, γ=0.45 at this time can provide a proportional gain equivalent to a proportional gain that is determined on the basis of the Ziegler-Nichols tuning rule, which is considered to provide a favorable proportional integral (PI) control response. Note that this is not a limitation on the value of γ.

A velocity control band determined on the basis of the proportional gain obtained on the basis of the constant γ is represented by wsc. The ratio of the integral gain to the proportional gain is represented by wsi. A corner frequency that is a boundary between a frequency band in which the integral compensation is dominant and a frequency band in which the proportional compensation is dominant is indicated by wsi. The gain calculation unit 211 calculates the integral gain such that the corner frequency wsi is smaller than the velocity control band wsc. Specifically, the integral gain is calculated such that a value resulting from multiplication of the velocity control band wsc by a constant δ that is greater than zero and smaller than one is the corner frequency wsi.

By calculating the integral gain in this manner and performing the adjustment, a high gain characteristic of a low frequency band produced due to the integral compensation can be provided. Additionally, the velocity control unit 204 can be provided that exhibits a favorable response that reduces the effect of a phase delay characteristic of the integral compensation on the velocity control band wsc and its vicinity.

The gain calculation unit 211 can thus calculate the proportional gain and the integral gain that enable the velocity control unit 204 to exhibit a favorable response on the basis of the minimum evaluation value Evmin. The velocity control unit 204 changes the values of the proportional gain and the integral gain on the basis of the received control gain signal Gn to thereby realize velocity control that exhibits a favorable response.

While the velocity control unit 204 calculates the first operation signal u1 from the sum of the proportional compensation and the integral compensation in the configuration described above, this is not a limitation on the method to calculate the first operation signal u1 in the velocity control unit 204. For example, the first operation signal u1 may be calculated from calculation based on the PID control, which includes derivative compensation. In this case, the control gain signal Gn is a signal that includes information on a proportional gain, an integral gain, and a derivative gain.

While a case in which the proportional gain and the integral gain in the velocity control unit 204 both have variable values has been described, only one of them, for example, only the proportional gain, may have a variable value. In this case, the control gain signal Gn is a signal that includes information on the proportional gain. A configuration in which only the integral gain has a variable value is similarly possible.

While a case in which the filter adjustment unit 210 retains 100 sets of filter parameter candidates has been described for the configuration described above for explanatory purposes, this is not a limitation on the number of sets of filter parameter candidates.

The motor control apparatus 20 according to the present embodiment operates as described above. When the operation of the oscillation instruction unit 103 is started on the basis of an operation external to the mechanical system, it is possible to easily determine the boundary magnitude of the velocity control band that is in accordance with the frequency characteristic of the filter unit 107 exhibited when each of the multiple sets of filter parameter candidates is set in the filter unit 107 in turn. Additionally, filter parameter candidates that maximize the velocity control band can be selected from the multiple sets of filter parameter candidates, and the frequency characteristic of the filter unit 107 can be thereby adjusted. Moreover, the velocity control unit 204 that adjusts the proportional gain and the integral gain of the velocity control unit 204 and thereby achieves a favorable response can be realized.

The present embodiment can provide a motor control apparatus that enables filter adjustment that maximizes a velocity control band with ease regardless of a presetting condition of a control gain in the velocity control unit and without the need for the burden of trial and error.

Additionally, it is possible to provide the motor control apparatus that adjusts the proportional gain and the integral gain of the velocity control unit and thereby achieves velocity control that exhibits a favorable response.

Third Embodiment

The motor control apparatus 10 according to the first embodiment retains multiple sets of filter parameter candidates in the filter adjustment unit. In the present embodiment, a motor control apparatus is described that has a function of determining a filter parameter candidate to be retained.

Figure 6:
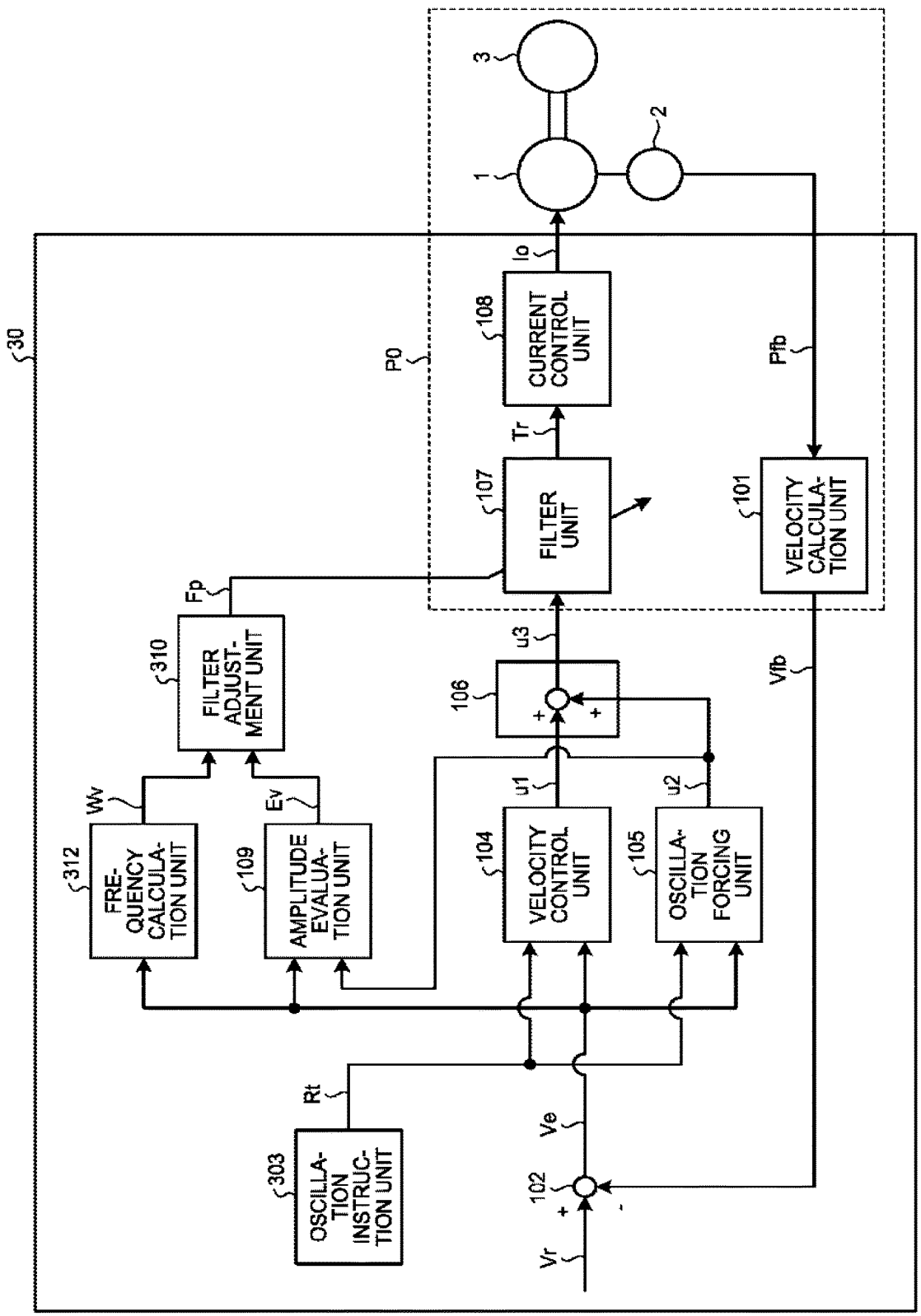
FIG. 6 is a block diagram illustrating a configuration of a motor control apparatus according to a third embodiment of the present invention.

FIG. 6 is a block diagram illustrating a configuration of a motor control apparatus 30 according to the present embodiment.

The motor control apparatus 30 includes, as its constituent elements, the velocity calculation unit 101, the subtracter 102, an oscillation instruction unit 303, the velocity control unit 104, the oscillation forcing unit 105, the third-operation-signal output unit 106, the filter unit 107, the current control unit 108, the amplitude evaluation unit 109, a filter adjustment unit 310, and a frequency calculation unit 312.

As in the first embodiment, a portion that receives the third operation signal u3 and outputs the velocity signal Vfb is referred to as the control target P0 and is indicated by a broken-line box in FIG. 6.

As in the first embodiment, the control target P0 can be viewed as a control target of the oscillation forcing unit 105 when the oscillation forcing unit 105 is regarded as a controller.

The control loop CL0 in the oscillation period is configured similarly to that in the first embodiment. That is, the control loop CL0 in the oscillation period includes the velocity calculation unit 101, the oscillation forcing unit 105, the filter unit 107, the current control unit 108, and the motor 1. As in the first embodiment, the control loop CL0 in the oscillation period also includes the subtracter 102, the third-operation-signal output unit 106, and the motor position detector 2.

In FIG. 6, the portions that are identical to those in the first embodiment are assigned symbols identical to the symbols in the first embodiment, and a detailed description thereof is omitted below.

An operation of the motor control apparatus 30 according to the present embodiment is described next.

The oscillation instruction unit 303 outputs the oscillation instruction signal Rt, which is a signal that indicates the on-state or the off-state. Starting its operation on the basis of an operation external to the mechanical system, the oscillation instruction unit 303 alternately outputs the oscillation instruction signal Rt in the on-state and the off-state a predetermined number of times and then stops the operation. The oscillation instruction signal Rt is in the off-state before the oscillation instruction unit 303 starts operating and when the oscillation instruction unit 303 stops operating and thereafter. The oscillation instruction signal Rt is changed to the on-state seven times in the present embodiment.

As described below, when the oscillation instruction signal Rt is changed to the on-state for the first time, six sets of parameter candidates are determined, and the evaluation of the six sets of parameter candidates is performed in second to seventh on-states.

After the oscillation instruction signal Rt is changed to the on-state for the first time to generate the limit cycle, the filter adjustment unit 310 determines the filter parameter candidates. For the operation of the filter adjustment unit 310 to generate the first limit cycle, a filter parameter Fp set in the filter unit 107 has been adjusted such that the transfer characteristic of the filter unit 107 becomes one.

After the first limit cycle is generated, the filter adjustment unit 310 determines and retains the six sets of filter parameter candidates, which are candidates for the filter parameters Fp of the filter unit 107, on the basis of an oscillation frequency Wv, to be described below, that is an input signal to the filter adjustment unit 310. Specifically, candidates for the notch frequency wn, which is one of the filter parameter candidates, are determined on the basis of the oscillation frequency Wv. The operation of the filter adjustment unit 310 performed after the determination of the filter parameter candidates is similar to that of the filter adjustment unit 110 in the first embodiment.

The filter adjustment unit 310 sets the filter parameter candidates in the filter unit 107 in a predetermined sequence.

The filter adjustment unit 310 also receives the evaluation value Ev as an input signal and stores the filter parameter candidates that are set in the filter unit 107 in association with the evaluation value Ev. The filter adjustment unit 310 sets the retained filter parameter candidates in the filter unit 107 in turn and acquires each associated evaluation value Ev.

The filter adjustment unit 310 compares the acquired evaluation values Ev sequentially and stores the smaller one so as to obtain a minimized evaluation value Ev. The filter adjustment unit 310 selects filter parameter candidates that are associated with the minimized evaluation value Ev as optimal filter parameters and sets the optimal filter parameters in the filter unit 107.

Here, it is satisfactory if one set of optimal filter parameters is obtained finally; thus, all the filter parameter candidates and all the evaluation values Ev associated with the filter parameter candidates do not necessarily need to be stored. The filter adjustment unit 310 may sequentially compare a newly acquired evaluation value Ev to an evaluation value Ev that has been found the smallest in each stage and store the smaller evaluation value Ev and its associated filter parameter candidates.

The frequency calculation unit 312 receives the velocity deviation Ve as an input signal, acquires a frequency having a maximum spectrum out of frequency components of the velocity deviation Ve in a predetermined time period as the oscillation frequency Wv, and outputs the oscillation frequency Wv. Alternatively, the oscillation frequency Wv with respect to a signal resulting from the action of a low-pass filter on the velocity deviation Ve may be used. A time period from when the sign of the velocity deviation Ve changes until when the sign changes next may be measured and the oscillation frequency Wv may be calculated on the basis of the inverse of the measured time period. The oscillation frequency Wv may be calculated on the basis of a method of subjecting the velocity deviation Ve to FFT processing and determining a frequency having the maximum spectrum. The frequency calculation unit 312 outputs the oscillation frequency Wv resulting from the calculation.

An effect produced by the motor control apparatus 30 according to the present embodiment is described below.

An effect produced by including the filter adjustment unit 310 and the frequency calculation unit 312 is described first. To generate the first limit cycle, the transfer characteristic of the filter unit 107 has been adjusted to one by the operation of the filter adjustment unit 310. The frequency calculation unit 312 acquires a frequency of the limit cycle here as the oscillation frequency Wv.

As in the first embodiment, the control target P0 in FIG. 6 receives the third operation signal u3 and outputs the velocity signal Vfb and can be viewed as a control target with respect to the oscillation forcing unit 105.

A frequency characteristic of the control target P0 is such that a gain peaks in the resonance frequency and that a phase is delayed abruptly before and after the resonance frequency. Thus, oscillation often occurs at a frequency near the resonance frequency. A phase crossover frequency, however, does not necessarily agree with the resonance frequency completely, and the ratio between the resonance frequency and the oscillation frequency is shifted within a range of 0.5 times to 2 times in many cases.

The notch filter advances the phase in a frequency band higher than the notch frequency wn and thus has an effect of maintaining stability at the resonance frequency even if the notch frequency wn is set to about 0.5 times to 1.0 times the resonance frequency. If there are multiple resonance frequencies, such as when a resonance frequency exists in a nearby band of about 0.5 times to 2.0 times another resonance frequency, setting the notch frequency wn in the middle of these frequencies improves the velocity control band in some cases.

Because of such complicated relationships, an optimal value of the notch frequency wn does not completely agree with the oscillation frequency Wv in many cases.

Thus, a notch frequency candidate wn(i) is determined as in the following equations (7) on the basis of the oscillation frequency Wv, where wn(i) represents a candidate for the notch frequency wn in i-th filter parameter candidates out of the six sets of filter parameter candidates. Here, i is a natural number indicating a number of filter parameter candidates and is a natural number from one to six in this example.

[Formula 7]

$$\left.\begin{array}{l} wn(1) = 0.5 * Wv \\ wn(2) = 0.7 * Wv \\ wn(3) = 0.9 * Wv \\ wn(4) = 1.0 * Wv \\ wn(5) = 1.5 * Wv \\ wn(6) = 2.0 * Wv \end{array}\right\} \quad (7)$$

The notch frequency wn(i) in the filter parameter candidates is determined with equations (7); thus, the filter unit 107, which is defined on the basis of each of the filter parameter candidates, has a frequency characteristic of the notch filter that reduces the gain in the vicinity of the resonance frequency. Here, the vicinity of the resonance frequency indicates a zone of frequencies 0.5 times to 2.0 times the resonance frequency. This is similarly applicable to the description provided below.

An effect produced by setting the notch filter in the vicinity of the resonance frequency is described below. The notch filter has a phase-lead characteristic at a frequency higher than the notch frequency wn; thus, by setting the notch filter in the vicinity of the resonance frequency, the characteristic of phase delay exhibited in the vicinity of the resonance frequency can be mitigated. Thus, by setting the notch filter, the phase crossover frequency can be heightened. Use of the six sets of filter parameter candidates determined by the filter adjustment unit 310 enables the notch filter to be set in the vicinity of the resonance frequency and thus the phase crossover frequency to be heightened and the velocity control band to be enlarged.

Additionally, the filter adjustment unit 310 can operate to select filter parameter candidates that maximize the velocity control band from the six sets of filter parameter candidates described above.

An operation of the filter adjustment unit 310 in the motor control apparatus 30 is similar to the operation of the filter adjustment unit 110 according to the first embodiment, except that the filter adjustment unit 310 determines multiple sets of filter parameter candidates on the basis of the oscillation frequency Wv. The effect produced based on the operations of the oscillation forcing unit 105, the amplitude evaluation unit 109, and the filter adjustment unit 310 is thus similar to that of the first embodiment. The motor control apparatus 30 can determine with ease the velocity control band that is in accordance with the frequency characteristic of the filter unit 107 exhibited when each of the multiple sets of filter parameter candidates is set in the filter unit 107 in turn. Filter parameter candidates that maximize the velocity control band can thus be selected from the multiple sets of filter parameter candidates, and the frequency characteristic of the filter unit 107 can be thereby adjusted.

While the frequency calculation unit 312 receives the velocity deviation Ve as an input signal and acquires a frequency having the maximum spectrum out of frequency components of the velocity deviation Ve in a predetermined time period as the oscillation frequency Wv in the configuration described above, this is not a limitation. The frequency calculation unit 312 may receive the velocity signal Vfb, in place of the velocity deviation Ve, as an input signal and acquire a frequency having a maximum spectrum out of frequency components of the velocity signal Vfb in a predetermined time period as the oscillation frequency Wv. Alternatively, the frequency calculation unit 312 may receive the second operation signal u2 as an input signal and acquire a frequency having a maximum spectrum out of frequency components of the second operation signal u2 in a predetermined time period as the oscillation frequency Wv.

While multiple candidate values are provided only for the notch frequency wn when the filter adjustment unit 310 determines the filter parameter candidates in the configuration described above, this is not a limitation. For example, multiple candidate values may be provided for the factors za and zb, which respectively define the width and the depth of the notch filter described in equation (2) in the first embodiment. Alternatively, six alternatives may be determined for the notch frequency wn by using equations (7) and three alternatives may be provided for each of the factors za and zb. In this case, 54 sets of parameter candidates are produced.

While the configuration in which sets of filter parameter candidates are determined on the basis of the oscillation frequency Wv of the limit cycle generated when the oscillation instruction signal Rt is changed to the on-state for the first time has been described, this is not a limitation on the method of determining a filter parameter candidate. For example, the notch filter may be set to the frequency of the oscillation frequency Wv of the first limit cycle, and sets of filter parameter candidates may be determined on the basis of the oscillation frequency Wv of the second limit cycle.

The motor control apparatus 30 according to the present embodiment operates as described above. That is, upon starting its operation on the basis of an operation external to the mechanical system, the oscillation instruction unit 303 determines multiple sets of filter parameter candidates. When each of the sets of filter parameter candidates is set in the filter unit 107 in turn, the boundary magnitude of the velocity control band in accordance with the frequency characteristic of the filter unit 107 can be determined with ease. Additionally, filter parameter candidates that maximize the velocity control band can be selected from the sets of filter parameter candidates, and the frequency characteristic of the filter unit 107 can be thereby adjusted.

The present embodiment can provide a motor control apparatus that enables filter adjustment that maximizes a velocity control band with ease regardless of a presetting condition of a control gain in the velocity control unit 104 and without the need for the burden of trial and error.

Additionally, the filter adjustment unit 310 can operate to determine multiple sets of filter parameter candidates; thus, a motor control apparatus that can adjust the filter with ease can be provided.

Fourth Embodiment

In the motor control apparatus 10 according to the first embodiment, the amplitude of the second operation signal u2 has predetermined magnitude. In the present embodiment, a motor control apparatus is described that has a function of adjusting the magnitude of the second operation signal u2 such that the amplitude of the velocity deviation Ve has predetermined magnitude.

Figure 7:
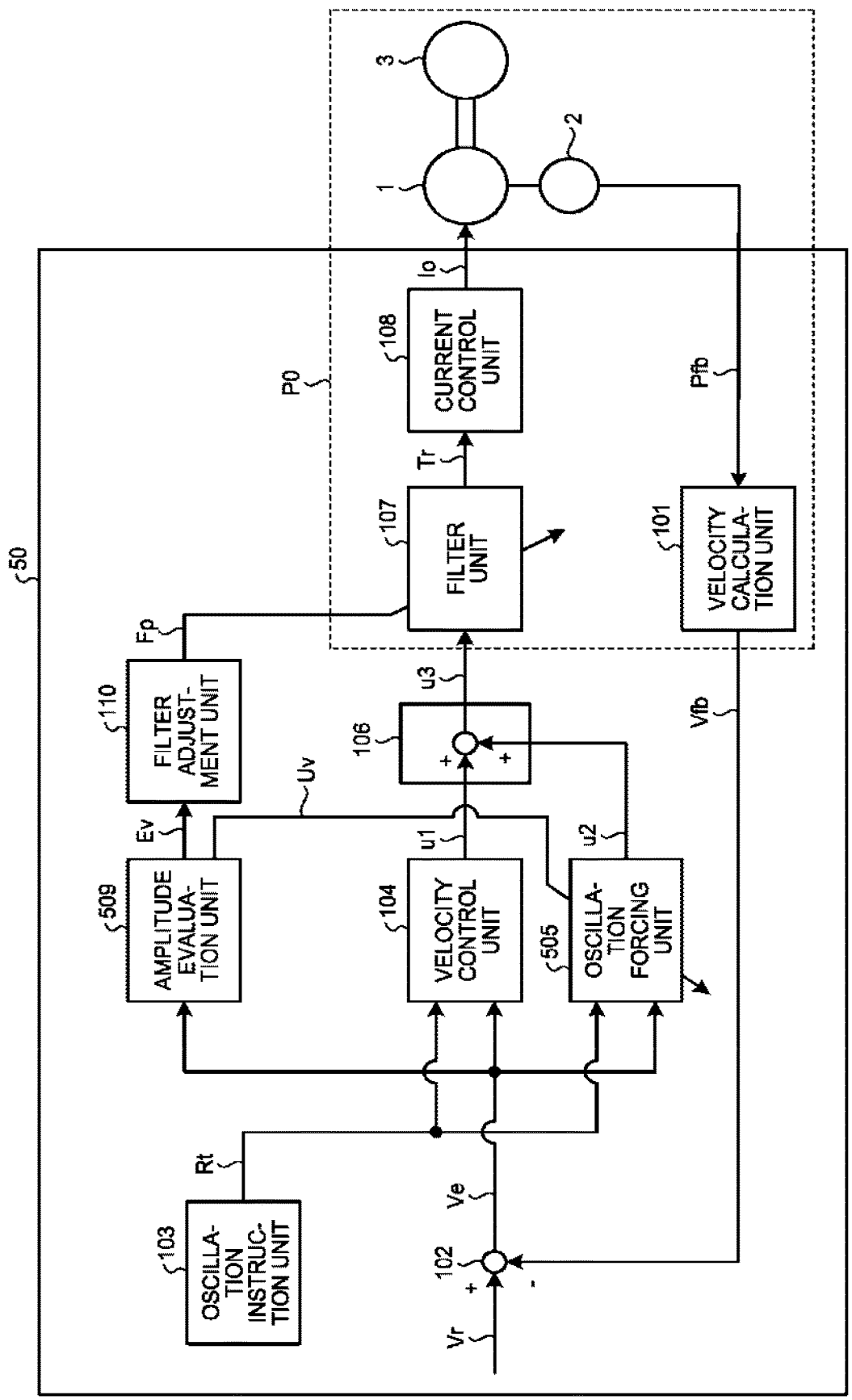
FIG. 7 is a block diagram illustrating a configuration of a motor control apparatus according to a fourth embodiment of the present invention.

FIG. 7 is a block diagram illustrating a configuration of a motor control apparatus 50 according to the present embodiment.

The motor control apparatus 50 includes, as its constituent elements, the velocity calculation unit 101, the subtracter 102, the oscillation instruction unit 103, the velocity control unit 104, an oscillation forcing unit 505, the third-operation-signal output unit 106, the filter unit 107, the current control unit 108, an amplitude evaluation unit 509, and the filter adjustment unit 110.

As in the first embodiment, a portion that receives the third operation signal u3 and outputs the velocity signal Vfb is referred to as the control target P0 and is indicated by a broken-line box in FIG. 7. As in the first embodiment, the control target P0 can be viewed as a control target of the oscillation forcing unit 505 when the oscillation forcing unit 505 is regarded as a controller.

In FIG. 7, the portions that are identical to those in the first embodiment are assigned symbols identical to the symbols in the first embodiment, and a detailed description thereof is omitted below.

An operation of the motor control apparatus 50 according to the present embodiment is described next.

The oscillation forcing unit 505 configures the control loop CL0 in the oscillation period together with the filter unit 107, the current control unit 108, the motor 1, and the velocity calculation unit 101 and operates to cause the control loop CL0 in the oscillation period to oscillate. Specifically, the oscillation forcing unit 505 receives the velocity deviation Ve and the oscillation instruction signal Rt and outputs, during the oscillation period in which the oscillation instruction signal Rt is in the on-state, a second operation signal u2 that has an operation amplitude of variable magnitude Uv and has a value the plus/minus sign of which is determined by a method described below.

A signal is output that results from calculation performed such that the signal has amplitudes of limited magnitude as a characteristic predetermined by nonlinear calculation based on the received velocity deviation Ve. Specifically, a value of one of +Uv and −Uv is selected as the second operation signal u2 in accordance with the sign of the deviation of the velocity deviation Ve. Here, a value of one of +Uv and −Uv may be selected in accordance with the sign of a signal resulting from the action of a low-pass filter on the velocity deviation Ve. Alternatively, a value of one of +Uv and −Uv may be selected not only in accordance simply with the sign of the velocity deviation Ve but also on the basis of a signal obtained by causing the velocity deviation Ve to have a nonlinear hysteresis characteristic.

The oscillation forcing unit 505 outputs the second operation signal u2 that has a value of zero during the normal period in which the oscillation instruction signal Rt is in the off-state. An operation amplitude Uv that is the amplitude of the second operation signal is adjusted by the amplitude evaluation unit 509.

The amplitude evaluation unit 509 receives the velocity deviation Ve and acquires the velocity amplitude Va, which is the amplitude of the velocity deviation Ve. Here, as a method to calculate the amplitude of the velocity deviation Ve, a maximum value of the absolute value of the signal provided during a period from when the sign of the velocity deviation Ve changes until when the sign changes next may be calculated as the amplitude of the signal. Alternatively, a signal having a maximum spectrum obtained by performing the FFT may be the amplitude of the velocity deviation Ve.

Additionally, an amplitude target value Vas that is a target value of the velocity amplitude Va is set in the amplitude evaluation unit 509. If the calculated velocity amplitude Va is smaller than the amplitude target value Vas, the operation amplitude Uv, which is described above, is gradually increased until the velocity amplitude Va has a value equivalent to the value of the amplitude target value Vas. The amplitude evaluation unit 509 calculates the ratio of the velocity amplitude Va to the operation amplitude Uv as the evaluation value Ev. Specifically, the amplitude evaluation unit 509 may calculate a value resulting from division of the velocity amplitude Va by the operation amplitude Uv as the evaluation value Ev.

An effect produced by the motor control apparatus 50 according to the present embodiment is described below.

An effect produced by including the oscillation forcing unit 505 and the amplitude evaluation unit 509 is described first. A condition is discussed in which the velocity control band is significantly adjusted in accordance with the frequency characteristic of the filter unit 107. Here, if the operation amplitude Uv has constant magnitude, the gain gP0 of the control target P0 in FIG. 7 has a small value. That is, the magnitude of the velocity amplitude Va of the limit cycle caused by the operation of the oscillation forcing unit 505 is reduced. In the present embodiment, the amplitude evaluation unit 509 operates to manipulate the operation amplitude Uv such that the velocity amplitude Va is increased to the amplitude target value Vas, which is predetermined. The velocity amplitude Va of the limit cycle caused by the operation of the oscillation forcing unit 505 thus has predetermined magnitude independently of the frequency characteristic of the filter unit 107.

The velocity amplitude Va has predetermined magnitude due to the operations of the oscillation forcing unit 505 and the amplitude evaluation unit 509 in the present embodiment; thus, the limit cycle can be measured using the motor position detector 2 that has a low resolving power and thus has difficulty in measuring a small velocity amplitude Va.

In the motor control apparatus 50 according to the present embodiment, the magnitude of the velocity amplitude Va changes at a constant rate with the change in magnitude of the operation amplitude Uv when the operation amplitude Uv is adjusted; thus, the ratio of the operation amplitude to the velocity amplitude Va does not depend on the magnitude of the operation amplitude Uv. That is, the evaluation value Ev is equivalent to that acquired in the first embodiment. The effect produced by the motor control apparatus 50 according to the present embodiment is thus similar to that produced by the motor control apparatus 10 according to the first embodiment.

The motor control apparatus 50 according to the present embodiment can thus determine in a short time the velocity control band that is in accordance with the frequency characteristic of the filter unit 107 exhibited when each of the multiple sets of filter parameter candidates is set in the filter unit 107 in turn. Additionally, filter parameter candidates that maximize the velocity control band can be selected from the multiple sets of filter parameter candidates, and the frequency characteristic of the filter unit 107 can be thereby adjusted.

While the amplitude evaluation unit 509 receives the velocity deviation Ve as an input signal and calculates the amplitude of the velocity deviation Ve as the velocity amplitude Va in the configuration described in the present embodiment, this is not a limitation. The amplitude evaluation unit 509 may receive the velocity signal Vfb as an input signal and calculates the amplitude of the velocity signal Vfb as the velocity amplitude Va.

The motor control apparatus 50 operates as described above. That is, when the operation of the oscillation instruction unit 103 is started on the basis of an operation external to the mechanical system, each of the multiple sets of filter parameter candidates is set in the filter unit 107 in turn, and thereby the boundary magnitude of the velocity control band in accordance with the frequency characteristic of the filter unit 107 can be determined with ease. Additionally, filter parameter candidates that maximize the velocity control band can be selected from the multiple sets of filter parameter candidates, and the frequency characteristic of the filter unit 107 can be thereby adjusted.

The present embodiment can provide a motor control apparatus that enables filter adjustment that maximizes a velocity control band with ease regardless of a presetting condition of a control gain in the velocity control unit and without the need for the burden of trial and error.

Fifth Embodiment

The motor control apparatus 10 according to the first embodiment calculates the torque command Tr by performing the filtering processing on the second operation signal u2, which is an output signal of the oscillation forcing unit 105.

In the present embodiment, a motor control apparatus that uses an output signal of the oscillation forcing unit as the torque command Tr is described.

Figure 8:
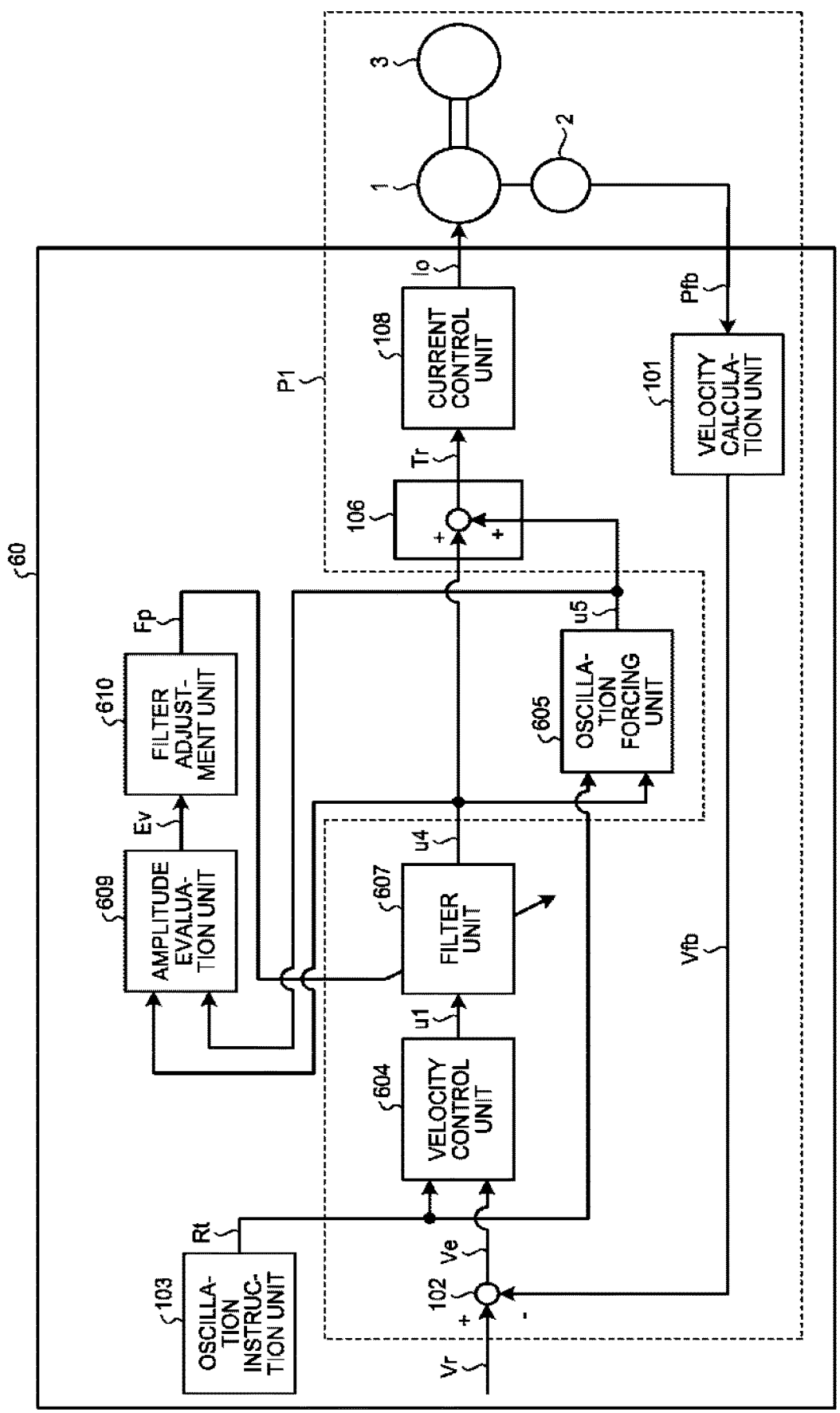
FIG. 8 is a block diagram illustrating a configuration of a motor control apparatus according to a fifth embodiment of the present invention.

FIG. 8 is a block diagram illustrating a configuration of a motor control apparatus 60 according to a fifth embodiment of the present invention.

The motor control apparatus 60 includes, as its constituent elements, the velocity calculation unit 101, the subtracter 102, the oscillation instruction unit 103, a velocity control unit 604, an oscillation forcing unit 605, a torque-command output unit 606, a filter unit 607, the current control unit 108, an amplitude evaluation unit 609, and a filter adjustment unit 610.

In FIG. 8, the portions that are identical to those in the first embodiment are assigned symbols identical to the symbols in the first embodiment, and a detailed description thereof is omitted below.

An operation of the motor control apparatus 60 according to the present embodiment is described next. The velocity control unit 604 receives the velocity deviation Ve and the oscillation instruction signal Rt. During the normal period, in which the oscillation instruction signal Rt is in the off-state, the velocity control unit 604 calculates the sum of the proportional compensation, which results from the multiplication of the velocity deviation Ve by the proportional gain, which is one of the control gains, and the integral compensation, which results from the multiplication of the velocity deviation Ve by the integral gain, which is one of the control gains, and the integration and outputs the result as the first operation signal u1.

When the oscillation instruction signal Rt is changed to the on-state to start the oscillation period, the velocity control unit 604 retains, as the integral compensation, a value immediately before the oscillation instruction signal Rt is changed to the on-state. The operation to retain the immediately preceding value can be realized by, for example, retaining the output of the integration with the integral gain at zero. The velocity control unit 604 calculates the sum of the proportional compensation resulting from multiplication of the velocity deviation Ve by a proportional gain Kp0 and the retained integral compensation and outputs the result as the first operation signal u1. Here, the proportional gain Kp0 does not necessarily need to be the same as the proportional gain used when the oscillation instruction signal Rt is in the off-state.

The operation to retain the integral compensation allows retention of the immediately preceding stable controlled state also during the oscillation period and stable transition to the oscillation period regardless of the degree of the load applied to the motor. Adjustment to be described below can thus be executed regardless of a presetting condition in the velocity control unit 604.

The filter unit 607 receives the first operation signal u1 and outputs a fourth operation signal u4 that is calculated by performing the filtering processing on the first operation signal u1. A filter of the filter unit 607 has a frequency characteristic defined on the basis a filter parameter Fp, and the frequency characteristic is variable in response to the filter parameter Fp.

The filter used for the calculation in the filter unit 607 according to the present embodiment is configured using, for example, the product of a low-pass filter and a notch filter. Here, filter parameters Fp include the notch frequency wn, which is the frequency at the center of the notch filter, the factor za and the factor zb, which respectively define the width (band width) and the depth (attenuation amplitude) of the notch filter, and the cutoff frequency w1 of the low-pass filter. The filter parameters Fp also include a switch that enables or disables the notch filter and a switch that enables or disables the low-pass filter. Here, when the notch filter is in a disabled state, the transfer function is one. Similarly, when the low-pass filter is in the disabled state, the transfer function is one.

The transfer function LPF of the low-pass filter in an enabled state and the transfer function NF of the notch filter in the enabled state are expressed by the filter parameters Fp as in equations (8) and (9), respectively.

[Formula 8]

$$LPF = \frac{w1}{s + w1} \quad (8)$$

[Formula 9]

$$NF = \frac{s^2 + 2*zb*wn*s + wn^2}{s^2 + 2*za*wn*s + wn^2} \quad (9)$$

Here, s represents a Laplace operator.

While the factors of a continuous system transfer function serve as the filter parameters Fp here, factors of a discrete system transfer function may serve as the filter parameters Fp. Additionally, the filter may have other configurations as long as the frequency characteristic of the filter is defined on the basis a parameter. For example, two or more low-pass filters may be placed in series, or another type of filter such as a phase-lead filter or a phase-delay filter may be used.

The oscillation forcing unit 605 configures a control loop CL1 in the oscillation period together with the filter unit 607, the current control unit 108, the motor 1, and the velocity calculation unit 101 and operates to cause the control loop CL1 in the oscillation period to oscillate as described below. Specifically, the oscillation forcing unit 605 receives the fourth operation signal and the oscillation instruction signal Rt and outputs, during the oscillation period in which the oscillation instruction signal Rt is in the on-state, a fifth operation signal u5 that has an amplitude of predetermined magnitude and has a value the plus/minus sign of which is determined by a method described below.

A signal is output that results from calculation performed such that the signal has an amplitude of magnitude predetermined by nonlinear calculation based on the received fourth operation signal u4. Here, the amplitude of the fifth operation signal u5, which is the output, is referred to as the operation amplitude Ua. The operation amplitude Ua is the amplitude of the output (output amplitude).

A value of one of +Ua and −Ua is selected as the fifth operation signal u5 in accordance with the sign of the fourth operation signal. Here, a value of one of +Ua and −Ua may be selected in accordance with the sign of a signal resulting from the action of a low-pass filter on the fourth operation signal. Alternatively, a value of one of +Ua and −Ua may be selected not only in accordance simply with the sign of the fourth operation signal but also on the basis of a signal obtained by causing the fourth operation signal to have a nonlinear hysteresis characteristic.

The oscillation forcing unit 605 outputs the fifth operation signal u5 that has a value of zero during the normal period in which the oscillation instruction signal Rt is in the off-state.

Figure 9:
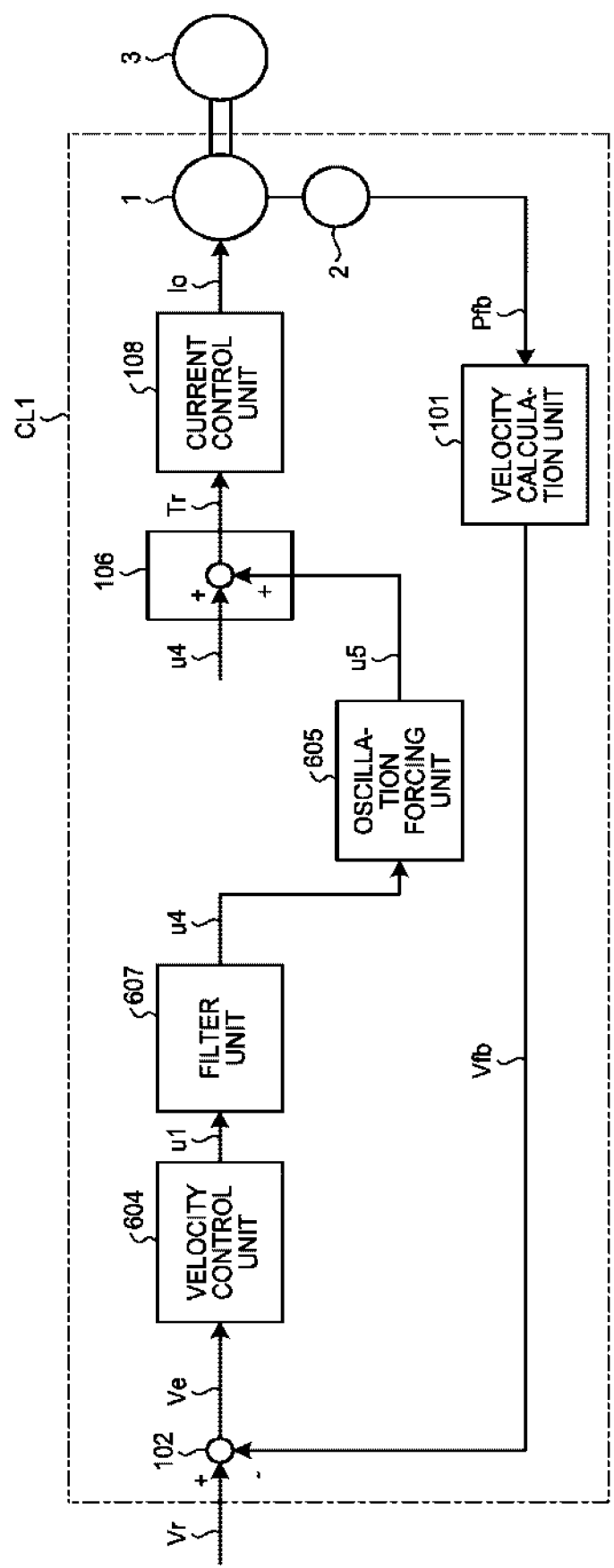
FIG. 9 is a block diagram illustrating a control loop in the oscillation period according to the fifth embodiment of the present invention.

An operation performed when the oscillation instruction signal Rt is in the on-state is described with reference to FIG. 9 next. FIG. 9 is a block diagram extracting and illustrating the control loop CL1 in the oscillation period, which is configured when the oscillation instruction signal Rt is in the on-state in the motor control apparatus 60 according to the fifth embodiment of the present invention. The control loop in the oscillation period is indicated by an alternate long and short dash line in the figure. The control loop CL1 in the oscillation period includes the velocity calculation unit 101, the oscillation forcing unit 605, the filter unit 607, the current control unit 108, and the motor 1 in FIG. 9. In FIG. 9, the control loop CL1 in the oscillation period also includes the subtracter 102, the torque-command output unit 606, and the motor position detector 2.

When the oscillation instruction signal Rt is changed to the on-state, the oscillation forcing unit 605 described above acts to cause the control loop CL1 in the oscillation period to oscillate. The control loop CL1 in the oscillation period may be established as long as the filter unit 607, the current control unit 108, the motor 1, the velocity calculation unit 101, and the oscillation forcing unit 605 are included.

Here, each of the fourth operation signal u4 and the fifth operation signal u5, which is output by the oscillation forcing unit 605, oscillates with a constant cycle. This oscillation is due to self-excited vibration, and the self-excited vibration is referred to as a limit cycle.

The fifth operation signal u5 oscillates with a predetermined amplitude.

The operation described above of the oscillation forcing unit 605 performed during the oscillation period in which the oscillation instruction signal Rt is in the on-state is similar to an operation performed in a method referred to as a limit cycle method used in temperature adjustment control or the like.

The torque-command output unit 606 receives the fourth operation signal u4 and the fifth operation signal u5, calculates the sum of the fourth operation signal u4 and the fifth operation signal u5, and outputs the result as the torque command Tr. A value of one of +Ua and −Ua is selected as the fifth operation signal u5 as described above; thus, the amplitude of the torque command Tr has the waveform of Ua when the fourth operation signal has a constant value.

While the torque-command output unit 606 outputs the torque command Tr resulting from the sum of the fourth operation signal u4 and the fifth operation signal u5 here, this is not a limitation. The torque-command output unit 606 may select and output the fourth operation signal u4 as the torque command Tr when the oscillation instruction signal Rt is in the off-state. Alternatively, the torque-command output unit 606 may select and output the fifth operation signal u5 as the torque command Tr.

The amplitude evaluation unit 609 receives the fourth operation signal u4, which is input to the oscillation forcing unit 605, and the fifth operation signal u5, which is output from the oscillation forcing unit 605, and acquires an input amplitude Ia, which is the amplitude of the fourth operation signal, and the operation amplitude Ua, which is the amplitude of the fifth operation signal u5. Here, the fifth operation signal u5 is a rectangular wave signal based on the operation of the oscillation forcing unit 605; thus, the operation amplitude Ua can be acquired by obtaining the absolute value of the fifth operation signal u5. As a method to calculate the input amplitude Ia, a maximum value of the absolute value of the signal provided during a period from when the sign of the fourth operation signal changes until when the sign changes next may be calculated as the input amplitude Ia. Alternatively, a signal having a maximum spectrum obtained by performing the FFT processing on the fourth operation signal described above may be the input amplitude Ia. Alternatively, a signal resulting from the action of a low-pass filter on one of the signals described above may be the input amplitude Ia.

The amplitude evaluation unit 609 calculates the ratio of the input amplitude Ia to the operation amplitude Ua as the evaluation value Ev. Specifically, the amplitude evaluation unit 609 calculates a value resulting from division of the input amplitude Ia by the operation amplitude Ua as the evaluation value Ev. That is, Ev=Ia/Ua. The amplitude evaluation unit 609 outputs the evaluation value Ev that is obtained immediately before the oscillation instruction signal Rt is changed from the on-state to the off-state.

Note that this method of obtaining the evaluation value Ev is not a limitation. For example, the operation amplitude Ua has predetermined magnitude and the value of the ratio of the input amplitude Ia to the operation amplitude Ua depends only on the input amplitude Ia in the present embodiment; thus, the input amplitude Ia may be simply used as the evaluation value Ev. It is needless to say that the amplitude evaluation unit 609 does not have to have the fifth operation signal u5 as the input signal in this case.

Alternatively, a value obtained by the action of a low-pass filter on a value resulting from division of the input amplitude Ia by the operation amplitude Ua may be used as the evaluation value Ev. The evaluation value Ev calculated here represents boundary magnitude of a velocity control band that depends on the characteristic of the filter unit 607 and is a value for evaluating a filter parameter Fp that is set in the filter unit 607.

The filter adjustment unit 610 retains multiple sets of filter parameter candidates, which are candidates for the filter parameters Fp of the filter unit 607, and sets the candidates in the filter unit 607 in a predetermined sequence. One set of filter parameter candidates is set in the filter unit 607 in the predetermined sequence during the normal period in which the oscillation instruction signal Rt is in the off-state. The filter adjustment unit 610 also receives the evaluation value Ev as an input signal and stores the filter parameters Fp that are set in the filter unit 607 in association with the evaluation value Ev.

The filter adjustment unit 610 sets the retained filter parameter candidates in the filter unit 607 in the predetermined sequence and acquires each associated evaluation value Ev.

The filter adjustment unit 610 compares the acquired evaluation values Ev sequentially and stores the smaller one so as to obtain a minimized evaluation value Ev. The filter adjustment unit 610 selects filter parameter candidates that are associated with the minimized evaluation value Ev as optimal filter parameters and sets the optimal filter parameters in the filter unit 607.

Here, it is satisfactory if one set of optimal filter parameters is obtained finally; thus, the filter adjustment unit 610 does not necessarily need to store all the filter parameter candidates and all the evaluation values Ev associated with the filter parameter candidates. The filter adjustment unit 610 may sequentially compare a newly acquired evaluation value Ev to an evaluation value Ev that has been found the smallest in each stage and store the smaller evaluation value Ev and its associated filter parameter candidates.

An effect produced by the motor control apparatus 60 according to the present embodiment is described next.

An effect produced by including the oscillation forcing unit 605 and the amplitude evaluation unit 609 as constituent elements is described first. The motor control apparatus 60 performs the velocity feedback control such that the velocity of the motor 1 approaches the velocity command Vr for the motor during the normal period in which the oscillation instruction signal Rt is in the off-state. The oscillation forcing unit 605 operates to cause the self-excited vibration referred to as the limit cycle as described above during the oscillation period in which the oscillation instruction signal Rt is in the on-state.

Upon starting its operation on the basis of an operation external to the mechanical system, the oscillation instruction unit 103 outputs the oscillation instruction signal Rt, and the limit cycle is caused. The boundary magnitude of the velocity control band of the velocity control unit 604, which varies depending on the frequency characteristic of the filter unit 607, can be determined on the basis of the waveform of the limit cycle caused by the operation of the oscillation forcing unit 605. The boundary magnitude of the velocity control band here refers to the magnitude of the control band realized when a control gain of the velocity control unit 604 is maximized within a range where the stability is maintained.

The reason for it is described below. With the oscillation forcing unit 605 regarded as a controller, a target that receives the fifth operation signal u5 and outputs the fourth operation signal u4 can be viewed as a control target with respect to the oscillation forcing unit 605. This control target is referred to as a control target P1 for explanatory purposes. Constituent elements included in the control target P1 are surrounded by a broken line in FIG. 8.

The limit cycle, which is caused on the basis of the operation of the oscillation forcing unit 605, oscillates with a frequency having a phase delayed by 180 degrees in the open loop characteristic of a transfer function of the control target P1. Here, the frequency having the phase of the transfer function of the control target P1 delayed by 180 degrees is defined as a frequency wP1. The frequency wP1 is referred to as a phase crossover frequency. A gain of the control target P1 with the frequency wP1 is defined as a gain gP1.

With the oscillation instruction signal Rt in the off-state and the velocity control being performed by the velocity control unit 604, increasing the proportional gain from a state in which the velocity control is stable causes steady-state vibration when the proportional gain reaches a specific value Kpu. This specific value Kpu is referred to as a boundary proportional gain. Here, the boundary proportional gain Kpu, the proportional gain Kp0 set in the velocity control unit 604 during the oscillation, and the gain gP1 described above satisfy the following equation (10).

[Formula 10]

$$Kpu = Kp0 * \frac{1}{gP1} \tag{10}$$

That is, when the magnitude of the gain gP1 is identified, the boundary proportional gain Kpu can be calculated using the known Kp0 and equation (10).

The gain gP1 is, by its definition, a value resulting from division of the amplitude of the fourth operation signal, which is an output signal provided when a sinusoidal signal with the frequency wP1 is input as the fifth operation signal u5 to the control target P1, by the amplitude of the fifth operation signal u5.

The rectangular wave signal with the frequency wP1 is input as the fifth operation signal u5 to the control target P1 in the limit cycle, which is caused by the oscillation forcing unit 605. That is, in the limit cycle, which is caused by the oscillation forcing unit 605, the calculation to obtain the evaluation value Ev, which results from the division of the input amplitude Ia by the operation amplitude Ua, is equivalent to calculation of the gain gP1, except that the fifth operation signal u5 is a rectangular wave signal. The amplitude of the rectangular wave signal can be approximately replaced by the amplitude of the sinusoidal signal on the basis of the describing function method. That is, the evaluation value Ev, which is the ratio of the input amplitude Ia to the operation amplitude Ua, is a good index indicative of the gain gP1.

The evaluation value Ev, which is calculated by the amplitude evaluation unit 609, and the gain gP1 satisfy the following relation.

[Formula 11]

$$gP1 = c*Ev \tag{11}$$

Here, the constant c is a constant that is defined on the basis of the describing function method. The constant c is a conversion factor for approximately replacing the rectangular wave signal with the sinusoidal signal on the basis of the describing function method. In the describing function method, the constant c can be calculated on the basis of a main-component factor when Fourier series expansion is performed on input/output signals. Specifically, the constant c ranges from 0.5 to 2.0.

When the operation amplitude Ua is constant, a value resulting from multiplication of the input amplitude Ia by c1 agrees with the gain gP1 on the basis of equation (4), where the constant c1 is newly defined as c1=c/Ua. Thus, when the operation amplitude Ua has constant magnitude and the input amplitude Ia is used as the evaluation value Ev as described above, the evaluation value Ev is proportional to the gain gP1, serving as a good index.

The boundary proportional gain Kpu, the proportional gain Kp0 set in the velocity control unit 604 during the oscillation, and the evaluation value Ev satisfy the following relationship on the basis of equations (10) and (11).

[Formula 12]

$$Kpu = Kp0 * \frac{1}{C*Ev} \quad (12)$$

In other words, the boundary proportional gain Kpu of the velocity control unit 604 in accordance with the frequency characteristic of the filter unit 607 can be estimated by acquiring the evaluation value Ev. When the proportional gain Kp0 is adjusted to a large value, the velocity control unit 604 has a large control band and thus has favorable control performance; however, the proportional gain Kp0 needs to be adjusted to a range smaller than the boundary proportional gain Kpu in order to maintain the stability of the velocity control. The value of the boundary proportional gain Kpu serves as a value that determines an upper limit of the velocity control band.

The magnitude of the boundary proportional gain Kpu takes different values depending on the frequency characteristic of the control target P1. In particular, when the mechanical system has a resonance characteristic, the value of the boundary proportional gain Kpu significantly depends on the frequency characteristic of the filter unit 607.

By adjusting the frequency characteristic of the filter unit 607 to thereby maximize the boundary proportional gain Kpu of the velocity control unit 604, maximization of an adjustable range of the proportional gain Kp0 of the velocity control unit 604 is realized, thereby enabling maximization of the control band in the velocity control. As described above, determining the boundary proportional gain Kpu is beneficial in the adjustment of the frequency characteristic of the filter unit 607.

In the case of a mechanical system, the operation of the oscillation forcing unit 605 described above generates the limit cycle at frequencies from a few tens of Hz to several thousands of Hz; thus, the evaluation value Ev can be acquired by generating the limit cycle for a short time of less than one second. Without the oscillation forcing unit 605, a task of gradually increasing the proportional gain by trial and error while taking measurements such as the velocity signal Vfb, which is the output, would be needed to determine the boundary proportional gain.

The operations of the oscillation forcing unit 605 and the amplitude evaluation unit 609 eliminate the need to gradually increase the proportional gain by trial and error to determine the boundary proportional gain as described above, thereby removing the burden of trial and error.

Additionally, the operations of the oscillation forcing unit 605 and the amplitude evaluation unit 609 enable estimation of the boundary proportional gain Kpu in a short time of less than one second in the case of a mechanical system.

The processing of the oscillation forcing unit 605 is performed after the filtering processing of the filter unit 607 in the present embodiment. The amplitude of the torque command Tr, thus, has constant magnitude similar to the magnitude of the amplitude of the fifth operation signal u5, which is output by the oscillation forcing unit 605, during the oscillation period in which the oscillation instruction signal Rt is in the on-state.

A constant amplitude of the torque command Tr can be realized at all times during the oscillation even when the frequency characteristic of the filter unit 607 is changed by the filter adjustment unit 610.

The torque command Tr having a predetermined amplitude enables the motor 1 to oscillate with sufficiently large amplitude at all times, thus allowing the amplitude evaluation unit 609 to evaluate the amplitude during the oscillation in a configuration using, for example, the motor position detector 2 that has a rough resolving power.

Thus, by including the oscillation forcing unit 605 and the amplitude evaluation unit 609 as constituent elements, the boundary magnitude of the velocity control band in accordance with the frequency characteristic of the filter unit 607 can be determined with ease.

The effect of the motor control apparatus 60, produced by adding the filter adjustment unit 610 as a constituent element, is similar to that of the motor control apparatus 10, produced by adding the filter adjustment unit 110 in the first embodiment.

By including the oscillation forcing unit 605 and the filter adjustment unit 610 as constituent elements, the limit cycle can be generated and filter parameter candidates can be evaluated regardless of a presetting condition in the velocity control unit 604 in the present embodiment. Specifically, filter parameter candidates can be evaluated regardless of the value of a control gain set in the velocity control unit 604, and, thus, adjustment that maximizes the velocity control band can be realized. That is, the adjustment can be executed regardless of a presetting condition in the velocity control unit 604.

While the velocity control unit 604 calculates the first operation signal u1 from the sum of the proportional compensation and the integral compensation in the description provided above, this is not a limitation on the method to calculate the first operation signal u1 in the velocity control unit 604. For example, the first operation signal u1 may be calculated from calculation based on the PID control, which includes also derivative compensation.

While the velocity signal Vfb is calculated on the basis of the position signal Pfb, which is detected by the motor position detector 2, the velocity signal Vfb may be obtained from a velocity detector that is attached to the motor 1 to detect the velocity of the motor.

While the amplitude evaluation unit 609 receives the fifth operation signal u5 as an input signal and calculates the amplitude of the fifth operation signal u5 as the operation amplitude Ua in the description provided above, the amplitude evaluation unit 609 may receive the torque command Tr as the input signal and calculate the amplitude of the torque command Tr as the operation amplitude Pa.

In the configuration described above, the amplitude evaluation unit 609 acquires a value resulting from division of the input amplitude Ia by the operation amplitude Pa as the evaluation value Ev and thereby can estimate the boundary proportional gain Kpu of the velocity control unit 604 in accordance with the frequency characteristic of the filter unit 607.

This, however, is not a limitation on the method of obtaining the evaluation value Ev for estimating the boundary proportional gain Kpu of the velocity control unit 604 in accordance with the frequency characteristic of the filter unit 607.

For example, a value resulting from division of the operation amplitude Pa by the input amplitude Ia, which is the inverse of the evaluation value Ev described above, may be used as the evaluation value. The evaluation value in this case is referred to as Ev1. The equation Ev1=Ua/Ia is satisfied. The boundary proportional gain Kpu can be acquired as a value resulting from division of the product of the proportional gain Kp0 of the velocity control unit 604 obtained during the oscillation and the evaluation value Ev1 by the constant c described above.

Acquiring the maximum value of the evaluation value Ev1 is equivalent to acquiring the minimum value of the evaluation value Ev; thus, in selecting an optimal filter parameter, a filter parameter candidate that is used when the maximum value of the evaluation value Ev1 is obtained may be the optimal filter parameter.

While the amplitude evaluation unit 609 acquires the fifth operation signal u5 as an input signal in the above configuration, the amplitude evaluation unit 609 may acquire the current Io as the input signal. When the current Io is acquired by the amplitude evaluation unit 609 as the input signal, the amplitude evaluation unit 609 may obtain, as the operation amplitude Ua, an amplitude of a signal resulting from the action of a transfer function that is an inverse model of the current control unit 108 on the received current Io.

The amplitude of the signal, which results from the action of a transfer function that is an inverse model of the current control unit 108 on the current Io, has magnitude equivalent to the magnitude of the amplitude of the fifth operation signal u5; thus, the amplitude evaluation unit 609 can acquire an evaluation value equivalent to the evaluation value Ev described above.

While the amplitude evaluation unit 609 acquires the fourth operation signal u4 as an input signal, the amplitude evaluation unit 609 may acquire the first operation signal u1 as the input signal. When the first operation signal u1 is acquired by the amplitude evaluation unit 609 as the input signal, the amplitude evaluation unit 609 may perform, on the received first operation signal u1, the same processing as the filtering processing performed by the filter unit 607, and obtain an amplitude of a resulting signal as the input amplitude Ia.

While the amplitude evaluation unit 609 acquires the fourth operation signal u4 as an input signal, the amplitude evaluation unit 609 may acquire the velocity deviation Ve as the input signal. When the velocity deviation Ve is acquired by the amplitude evaluation unit 609 as the input signal, the amplitude evaluation unit 609 may perform, on the velocity deviation Ve, the same processing as the processing performed by the velocity control unit 604 and by the filter unit 607, and obtain an amplitude of a resulting signal as the input amplitude Ia.

The amplitude evaluation unit 609 acquires the fourth operation signal u4 as an input signal in the description provided above and it is satisfactory if the amplitude of the fourth operation signal u4 at the frequency wP1 is acquired. Thus, a signal obtained by performing low-pass filtering processing on the fourth operation signal u4, a signal obtained by performing band-pass filtering processing on the fourth operation signal u4, or a signal obtained by performing high-pass filtering processing on the fourth operation signal u4 may be used as the input signal.

The motor control apparatus 60 according to the present embodiment operates as described above. That is, when the operation of the oscillation instruction unit 103 is started on the basis of an operation external to the mechanical system, each of the multiple sets of filter parameter candidates is set in the filter unit 607 in turn, and thereby the boundary magnitude of the velocity control band in accordance with the frequency characteristic of the filter unit 607 can be determined with ease. Additionally, filter parameter candidates that maximize the velocity control band can be selected from the multiple sets of filter parameter candidates, and the frequency characteristic of the filter unit 607 can be thereby adjusted.

The present embodiment can provide a motor control apparatus that enables filter adjustment that maximizes a velocity control band with ease regardless of a presetting condition of a control gain in the velocity control unit and without the burden of trial and error.

REFERENCE SIGNS LIST 1 motor; 3 mechanical load; 10, 20, 30, 50, 60 motor control apparatus; 101 velocity calculation unit; 103, 303 oscillation instruction unit; 104, 204, 604 velocity control unit; 105, 605 oscillation forcing unit; 106 third-operation-signal output unit; 107, 607 filter unit; 108 current control unit; 109, 509, 609 amplitude evaluation unit; 110, 210, 310, 610 filter adjustment unit; 211 gain calculation unit; 312 frequency calculation unit; 606 torque-command output unit.

The invention claimed is:

1. A motor control apparatus that calculates, based on a velocity signal that indicates velocity of a motor coupled to a mechanical load and a velocity command that is a command value for the velocity of the motor, a torque command that is a command value for torque of the motor to control the motor, the apparatus comprising:
  a velocity circuitry configured to
    calculate and output a first operation signal such that the velocity signal agrees with the velocity command;
  provide current to the motor based on a basis of the torque command;
    output the velocity signal;
    output an oscillation instruction signal that is a signal indicative of an on-state that gives an instruction to cause oscillation or an off-state that gives an instruction to stop the oscillation;
    perform filtering processing having a frequency characteristic defined by a filter parameter;
    configure a control loop in an oscillation period to cause the control loop in the oscillation period to oscillate by self-excited vibration during the oscillation period when the oscillation instruction signal is in the on-state;
    acquire, as an evaluation value, a ratio of an amplitude of an input signal to an amplitude of an output signal when the control loop in the oscillation period is caused to oscillate; and
    acquire evaluation values when a plurality of filter parameter candidates are set sequentially, select, by comparing the evaluation values, the filter parameter that achieves a smaller evaluation value, and set the selected filter parameter.

2. The motor control apparatus according to claim 1, wherein the circuitry is further configured to perform the filtering processing on the first operation signal and output the torque command so as to control the motor during a normal period when the oscillation instruction signal is in the off-state.

3. The motor control apparatus according to claim 1, wherein
  the circuitry is further configured to
    receive one of a velocity deviation that is a deviation of the velocity signal from the velocity command and the velocity signal and output a second operation signal, obtain and output a third operation signal by adding the first operation signal and the second operation signal together or selecting one of the first operation signal and the second operation signal, and perform the filtering processing on the third operation signal and output the torque command during the oscillation period.

4. The motor control apparatus according to claim 1, wherein the circuitry is further configured to output a positive or negative value having a predetermined magnitude in accordance with a positive or negative sign of the input signal.

5. The motor control apparatus according to claim 1, wherein the circuitry is further configured to acquire, as the evaluation value, a value resulting from division of the amplitude of the input signal by the amplitude of the output signal or a value resulting from division of the amplitude of the output signal by the amplitude of the input signal.

6. A motor control apparatus that calculates, based on a velocity signal that indicates velocity of a motor coupled to a mechanical load and a velocity command that is a command value for the velocity of the motor, a torque command that is a command value for torque of the motor to control the motor, the apparatus comprising:

circuitry configured to calculate and output a first operation signal such that the velocity signal agrees with the velocity command;

provide current to the motor based on a basis of the torque command;

output the velocity signal;

output an oscillation instruction signal that is a signal indicative of an on-state that gives an instruction to cause oscillation or an off-state that gives an instruction to stop the oscillation;

to perform filtering processing having a frequency characteristic defined by a filter parameter;

configure a control loop in an oscillation period to cause the control loop in the oscillation period to oscillate during the oscillation period when the oscillation instruction signal is in the on-state;

acquire, as an evaluation value, a ratio of an amplitude of an input signal to an amplitude of an output signal when the control loop in the oscillation period is caused to oscillate; and to acquire evaluation values when a plurality of filter parameter candidates are set sequentially, select, by comparing the evaluation values, the filter parameter that achieves a smaller evaluation value, and set the selected filter parameter, wherein the circuitry is further configured to perform the filtering processing on the first operation signal and output a fourth operation signal, receive the fourth operation signal and output a fifth operation signal, and obtain and output the torque command by adding the fourth operation signal and the fifth operation signal together or selecting one of the fourth operation signal and the fifth operation signal.

7. The motor control apparatus according to claim 6, wherein the circuitry is further configured to perform the filtering processing on the first operation signal and output the torque command so as to control the motor during a normal period when the oscillation instruction signal is in the off-state.

8. The motor control apparatus according to claim 6, wherein the circuitry is further configured to output a positive or negative value having a predetermined magnitude in accordance with a positive or negative sign of the input signal.

9. The motor control apparatus according to claim 6, wherein the circuitry is further configured to acquire, as the evaluation value, a value resulting from division of the amplitude of the input signal by the amplitude of the output signal or a value resulting from division of the amplitude of the output signal by the amplitude of the input signal.

10. A motor control method that calculates, based on a velocity signal that indicates velocity of a motor coupled to a mechanical load and a velocity command that is a command value for the velocity of the motor, a torque command that is a command value for torque of the motor to control the motor, the method comprising:

calculating and outputting a first operation signal such that the velocity signal agrees with the velocity command;

providing current to the motor based on the torque command;

outputting the velocity signal;

outputting an oscillation instruction signal that is a signal indicative of an on-state that gives an instruction to cause oscillation or an off-state that gives an instruction to stop the oscillation;

performing filtering processing having a frequency characteristic defined by a filter parameter;

configuring a control loop in an oscillation period to cause the control loop in the oscillation period to oscillate by self-excited vibration during the oscillation period when the oscillation instruction signal is in the on-state;

acquiring, as an evaluation value, a ratio of an amplitude of an input signal to an amplitude of an output signal when the control loop in the oscillation period is caused to oscillate; and acquiring evaluation values when a plurality of filter parameter candidates are set sequentially, select, by comparing the evaluation values, the filter parameter that achieves a smaller evaluation value, and set the selected filter parameter.

11. The motor control method according to claim 10, wherein the performing step further comprises performing the filtering processing on the first operation signal and outputting the torque command so as to control the motor during a normal period when the oscillation instruction signal is in the off-state.

12. The motor control method according to claim 10, further comprising:

receiving one of a velocity deviation that is a deviation of the velocity signal from the velocity command and the velocity signal and outputting a second operation signal, obtaining and outputting a third operation signal by adding the first operation signal and the second operation signal together or selecting one of the first operation signal and the second operation signal, and performing the filtering processing on the third operation signal and output the torque command during the oscillation period.

13. The motor control method according to claim 10, further comprising outputting a positive or negative value having a predetermined magnitude in accordance with a positive or negative sign of the input signal.

14. The motor control method according to claim 10, further comprising acquiring, as the evaluation value, a value resulting from division of the amplitude of the input signal by the amplitude of the output signal or a value resulting from division of the amplitude of the output signal by the amplitude of the input signal.

* * * * *